United States Patent
Chen et al.

(10) Patent No.: US 12,322,465 B2
(45) Date of Patent: *Jun. 3, 2025

(54) DIGITAL VERIFY FAILBIT COUNT (VFC) CIRCUIT

(71) Applicant: Yangtze Memory Technologies Co., Ltd., Wuhan (CN)

(72) Inventors: Teng Chen, Wuhan (CN); Masao Kuriyama, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 186 days.

This patent is subject to a terminal disclaimer.

(21) Appl. No.: 18/149,842

(22) Filed: Jan. 4, 2023

(65) Prior Publication Data
US 2024/0212780 A1    Jun. 27, 2024

(30) Foreign Application Priority Data
Dec. 26, 2022  (CN) .......................... 202211677051.9

(51) Int. Cl.
*G11C 29/44* (2006.01)
*G11C 29/12* (2006.01)

(52) U.S. Cl.
CPC .......... *G11C 29/44* (2013.01); *G11C 29/1201* (2013.01)

(58) Field of Classification Search
CPC ..... G11C 29/44; G11C 29/1201; G11C 29/70; G11C 29/56; G11C 29/56012
See application file for complete search history.

(56) References Cited

U.S. PATENT DOCUMENTS

| | | | |
|---|---|---|---|
| 2012/0072806 A1* | 3/2012 | Tabata ................. | G06F 11/1048 714/764 |
| 2023/0420014 A1* | 12/2023 | Park ......................... | G11C 7/14 |
| 2024/0212765 A1* | 6/2024 | Chen ........................ | H03M 7/04 |
| 2024/0212766 A1* | 6/2024 | Chen .................. | G11C 16/3459 |

* cited by examiner

*Primary Examiner* — Sultana Begum
(74) *Attorney, Agent, or Firm* — Anova Law Group, PLLC

(57) ABSTRACT

A failbit counting method includes sequentially receiving, at an input of a counter, a bit group including one or more verification bits. Each of the one or more verification bits is a fail bit or a pass bit. The counter includes one or more counter stages coupled in series from the input. The method further includes, for one verification bit of the one or more verification bits, performing a determination process according to a position of the one verification bit in the group to select one of the one or more counter stages for writing a fail bit or to decide to discard the one verification bit.

20 Claims, 21 Drawing Sheets

DIGITAL VERIFY FAILBIT COUNT (VFC) CIRCUIT

CROSS-REFERENCE TO RELATED APPLICATION

This application claims the priority of Chinese Patent Application No. 202211677051.9, filed on Dec. 26, 2022, the content of which is incorporated herein by reference in its entirety.

FIELD OF THE TECHNOLOGY

The present disclosure relates to the field of memory technology and, more particularly, to a digital Verify Fail bit Count (VFC) circuit for memory devices.

BACKGROUND OF THE DISCLOSURE

A memory device, such as a three-dimensional (3D) memory device, stores data by storing electric charge, such as electron, in a storage unit, also referred to as a "memory cell." In a memory device, a process of counting memory cells with failed or erroneous data writing is referred to as Verify Failbit Count (VFC). Correspondingly, a circuit that performs the VFC is also referred to as a VFC circuit. The VFC circuit occupies space in the memory device and increases power consumption of the memory device. Further, as existing VFC circuits use analog method to sense failbit numbers, current will be needed during the process. Current can be impacted by several factors, such as power drop, transistor mismatch, and signal routing, which can lead to under count and result in yield loss. Therefore, the VFC circuit needs to be improved.

SUMMARY

In accordance with the disclosure, there is provided a failbit counting method including sequentially receiving, at an input of a counter, a bit group including one or more verification bits. Each of the one or more verification bits is a fail bit or a pass bit. The counter includes one or more counter stages coupled in series from the input. The method further includes, for one verification bit of the one or more verification bits, performing a determination process according to a position of the one verification bit in the group to select one of the one or more counter stages for writing a fail bit or to decide to discard the one verification bit.

Also in accordance with the disclosure, there is provided a memory device including a memory cell array including one or more memory sections each including one or more memory cells, a buffer circuit including one or more buffers each coupled to one of the one or more memory sections, a verify failbit count (VFC) circuit coupled to the buffer circuit and including a counter, and a control logic coupled to the VFC circuit. The counter includes one or more counter stages coupled in series from an input of the counter. The control logic is configured to control the counter to sequentially receive, at the input of the counter, a bit group including one or more verification bits. Each of the one or more verification bits is a fail bit or a pass bit. The control logic is further configured to control the counter to, for one verification bit of the one or more verification bits, perform a determination process according to a position of the one verification bit in the group to select one of the one or more counter stages for writing a fail bit or to decide to discard the one verification bit.

Also in accordance with the disclosure, there is provided a memory system including a memory device and a memory controller coupled to the memory device and configured to control the memory device. The memory device includes a memory cell array including one or more memory sections each including one or more memory cells, a buffer circuit including one or more buffers each coupled to one of the one or more memory sections, a verify failbit count (VFC) circuit coupled to the buffer circuit and including a counter, and a control logic coupled to the VFC circuit. The counter includes one or more counter stages coupled in series from an input of the counter. The control logic is configured to control the counter to sequentially receive, at the input of the counter, a bit group including one or more verification bits. Each of the one or more verification bits is a fail bit or a pass bit. The control logic is further configured to control the counter to, for one verification bit of the one or more verification bits, perform a determination process according to a position of the one verification bit in the group to select one of the one or more counter stages for writing a fail bit or to decide to discard the one verification bit.

DESCRIPTION OF EMBODIMENTS

Figure 1A:
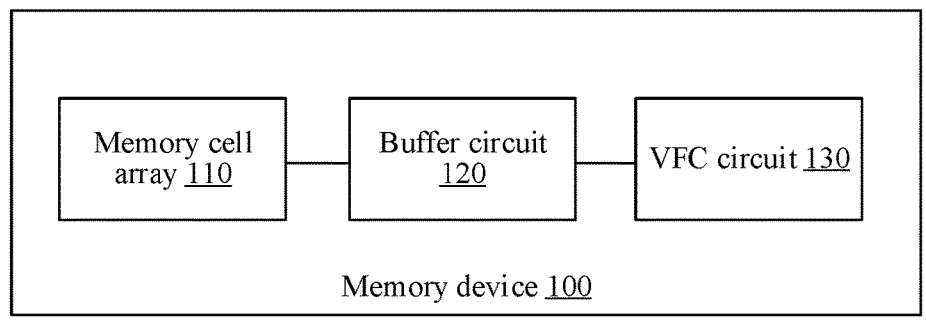
FIG. 1A is a schematic structural diagram of an example memory device according to some aspects of the present disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

References in the specification to "one embodiment," "an embodiment," "an exemplary embodiment," "some embodiments," etc., indicate that the embodiment described may include a particular feature, structure, or characteristic, but not every embodiment necessarily includes the particular feature, structure, or characteristic. Moreover, such phrases do not necessarily refer to the same embodiment.

Further, when a particular feature, structure or characteristic is described in connection with an embodiment, it would be within the knowledge of a person skilled in the art to affect such feature, structure or characteristic in connection with other embodiments whether or not explicitly described. A person of ordinary skill in the art can make modifications to the described embodiments according to the principle of the present disclosure. For example, one or more components of the disclosed device can be omitted or one or more components not explicitly described above can be added to the device. Similarly, one or more steps in the disclosed method can be omitted or one or more steps not explicitly described above can be included in the method.

Unless otherwise defined, all technical and scientific terms used in this disclosure have the same or similar meanings as generally understood by those having ordinary skill in the art. As described herein, the terms used in the specification of the present disclosure are intended to describe example embodiments, instead of limiting the present disclosure. In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," may be understood to convey a singular usage or to convey a plural usage, depending at least in part upon context.

As used herein, when a first component is referred to as "connected" or "coupled" to a second component, it is intended that the first component may be directly connected or coupled to the second component or may be indirectly connected or coupled to the second component via a third component between them. Further, the connection or coupling can include mechanical and/or electrical connection or coupling.

In this disclosure, a value or a range of values may refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by those having ordinary skill in the art. The term "about" or "approximately" associated with a state can allow a slight deviation from the state.

Further, terms such as "first" and "second" are used to distinguish similar features and do not necessarily require or connote a specific sequence or order.

FIG. 1A is a schematic structural diagram of an example memory device 100 according to some aspects of the present disclosure. As shown in FIG. 1, the memory device 100 includes a memory cell array 110, a buffer circuit 120 coupled to the memory cell array 110, and a verify failbit count (VFC) circuit 130 coupled to the buffer circuit 120.

The memory cell array 110 includes a plurality of memory cells, and the memory cells can be, e.g., Not-AND (NAND) memory cells, Not-OR (NOR) memory cells, and/or memory cells of other types. The memory cells of the memory array 110 can be arranged in a two-dimensional (2D) array and/or in a three-dimensional (3D) array.

For example, the memory array 110 can be a 3D memory array, and the memory cells of the 3D memory array can be configured in rows and columns. Memory cells of a row can be coupled together by a conductive layer (e.g., a metal layer) of the 3D memory array. For example, the control gate of each memory cell of a row can be coupled to the conductive layer. The conductive layer can be coupled to an access line (e.g., a word line). Memory cells of a column can be coupled in series. For example, a drain of a memory cell can be coupled to a source of an adjacent memory cell in a column. Hence, the memory cells of a column can form a string, and such a string is also referred to as a "memory string." Each column of the 3D memory array can be selectively coupled to a data line (e.g., a bit line). Memory cells of the 3D memory array can be written (or programmed) to one of two or more data states by write operations.

Logically, the memory cells of the memory cell array 110 can be arranged in memory targets, planes, blocks, and/or pages in some implementations. For example, the memory array 110 can include one or more memory targets logically. In some implementations, a memory target can contain one or more planes. A plane can contain one or more blocks. A block can contain a plurality of pages. A page, storing a number of bytes or words, can contain one or more rows of memory cells and can be the smallest addressable unit for read and write operations. In some other implementations, a memory target can contain one or more logical units (LUNs). A LUN can contain one or more planes. In such cases, an LUN can be the minimum unit that can execute commands and report status independently. During read and write operations, data can be read from or written to the memory array 110 in pages. During erase operations, data can be erased in blocks, i.e., memory cells in a block can be reset together by a block erase operation.

As noted above, the memory cells of the memory cell array 110 can be divided (not necessarily physically divided) into one or more sections (memory sections), such as pages. Correspondingly, the buffer circuit 120 can include a plurality of buffers each coupled to one of the one or more sections of memory cells. For example, the memory cells in a memory string can be coupled to a bit line, and a buffer of the buffer circuit 120 can be coupled to the memory cells in the memory string via the bit line. As another example, the buffers in the buffer circuit 120 can be page buffers each coupled to the memory cells corresponding to one page of the memory cell array 110. The buffers in the buffer circuit 120 can be configured to read and program (write) data from and to the memory cell array 110 according to the control signals from, e.g., the control logic 140. In one example, the buffers in the buffer circuit 120 can store program data (write data) to be programmed into the memory cell array 110. In another example, the buffers in the buffer circuit 120 can sense the signals (e.g., current) from connection lines coupling the buffers to the sections of the memory cell array 110 to verify whether the data has been properly programmed into target memory cells coupled to select word lines. In still another example, the buffers in the buffer circuit 120 can also sense the low power signals (e.g., current) from connection lines that represents data bits stored in the memory cells and amplify the small voltage swing to recognizable logic levels in a read operation.

Figure 1B:
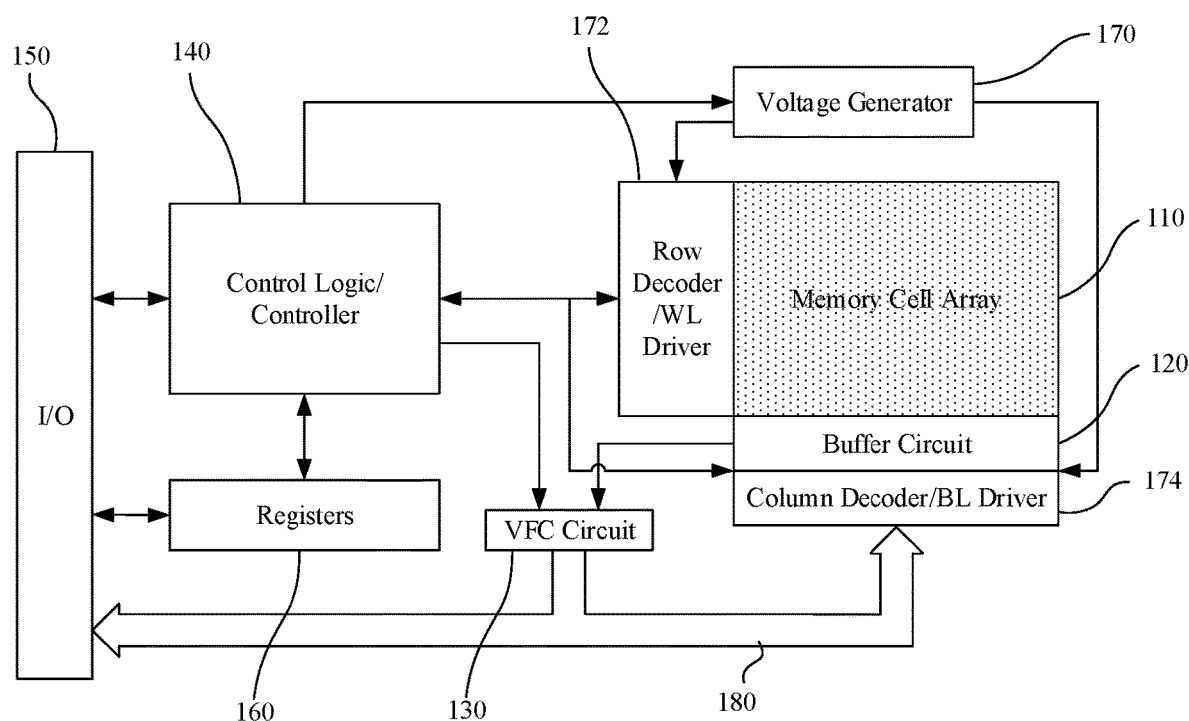
FIG. 1B is another schematic structural diagram of the example memory device according to some aspects of the present disclosure.

FIG. 1B is another schematic structural diagram of the memory device 100 according to some aspects of the present disclosure. As shown in FIG. 1B, the memory device 100 further includes a control logic 140, an input/output (I/O) interface 150, one or more registers 160, a voltage generator 170, a row decoder 172 (word line (WL) driver), and a column decoder 174 (bit line (BL) driver). The memory device 100 also includes a bus 180 coupling various components of the memory device 100, e.g., the buffer circuit 120, the VFC circuit 130, and the row/column decoders 172/174, to the I/O interface 150.

The control logic 140 can function as a controller of the memory device 100 and implement various functions of the memory device 100. For example, the control logic 140 can perform read operations, write (or programming) operations, and erase operations on the memory cell array 110.

The I/O interface 150, which can also be referred to as an I/O component or I/O connections, can contain an I/O circuit to receive an input of command signals, address signals, and data signals to the memory device 100 and transmit data and status information from the memory device 100 to another device (e.g., a host device/an external memory controller). As shown in FIG. 1B, the I/O interface 150 is coupled to the control logic 140 and can be configured to buffer and relay data/information to and from the control logic. For example, when there exists an external controller (e.g., memory controller 2006, 2104, or 2204, or processor 2313 described below), the I/O interface 150 can act as a control buffer to buffer and relay control commands (e.g., program command) received from the external controller to the control logic 140 and status information received from the control logic 140 to the external controller. The I/O interface 150 is also coupled to the column decoder 174 and can act as a data I/O interface and a data buffer to buffer and relay the data to and from the memory cell array 110. As shown in FIG. 1B, the I/O interface 150 is also coupled to the one or more registers 160.

The one or more registers 160 can include, e.g., a command/address register and/or a status register. The command/address register can latch or temporarily store command signals and address signals and pass the command and address signals to the control logic 140, the row decoder 172, and the column decoder 174. The status register can latch status information. For example, the status register can store status information related to read operation, write operation, and/or erase operation that will be performed or is being performed. The status register can also store status information that will be transmitted to another device (e.g., a host device) via the I/O interface 150. In some implementations, the control logic 140 can include the status register, i.e., the status register can be a part of the control logic 140.

The row decoder 172 and the column decoder 174 can decode row and column address signals, respectively, for accessing the memory cell array 110. The row decoder 172 and column decoder 174 can receive different voltages from the voltage generator 170 and transfer the received voltages to selected items, such as a word line or a bit line of the memory cell array 110. For example, the row decoder 172 can be coupled to the memory cell array 110 via word lines, and can select word lines based on row addresses. The row decoder 172 can be configured to be controlled according to the control signals by the control logic 140 and select/unselect blocks of the memory cell array 110 and select/unselect word lines of a block. The row decoder 172 can be further configured to drive word lines using word line voltages generated from the voltage generator 170. On the other hand, the column decoder 174 can be configured to be controlled by the control logic 140 and select one or more memory strings by applying bit line voltages generated from the voltage generator 170.

The voltage generator 170 can be configured to be controlled by the control logic 140 and generate various voltages required for the operation of the memory device 100, such as word line voltages, select/unselect voltages, bit line voltages, and source line voltages to be supplied to the memory cell array 110. In some implementations, the voltage generator 170 can generate voltages and supply to the buffer circuit 120, the row decoder 172, and the column decoder 174.

Further, the I/O interface 150 can detect command signals, address signals, and data signals from the input. In some implementations, the I/O interface 150 can transmit command and address signals to the command/address register, and transmit data signals to the buffer circuit 120. The I/O interface 150 can also receive data signals from the buffer circuit 120 after the data signals are read from the memory cell array 110 and then transmit the data signals to another device (e.g., a host device/external memory controller). In some cases, the control logic 140 can transmit the command, address, and data signals to the one or more registers 160 and the buffer circuit 120 by sending instructions to the I/O interface 150.

According to some aspects of the present disclosure, after a verification operation on the memory cell array 110 is performed, the buffer circuit 120 can store the verification results and pass the results to the VFC circuit 130. Each buffer (such as a page buffer) outputs a signal to the VFC circuit 130 to indicate whether a memory cell corresponding to the buffer has write failure or error. If a memory cell of the memory cell array 110 passes the verification operation, the signal output by the corresponding buffer to the VFC 120 can be, e.g., 0. In contrast, if a memory cell fails the verification operation, the signal output by the corresponding buffer to the VFC 120 can be, e.g., 1. By processing the signals from the buffer circuit 120, the VFC circuit 130 can obtain a count of memory cells that fail the verification operation and output the count. For example, the VFC circuit 130 can output the count to the I/O interface 150 via the bus 180. Further, the control logic 140 can also send control commands to the VFC circuit 130 to control the operation of the VFC circuit 130.

In some implementations, the VFC circuit is a digital VFC circuit, which can take binary signals from a buffer circuit that indicate verification results of the memory cells, and digitally accumulate them to obtain a total count of failures in the memory cells during the verification operation. Because the accuracy of the digital VFC circuit is not affected by power drop (decreasing of power supply voltage), transistor mismatch, and signal routing discrepancy, etc., the VFC circuit according to some aspects of the present disclosure can count the failures in a memory cell array (number of fail bits) with a high accuracy. An accurate count of the failures in the memory cell array increases the yield. Example VFC circuits according to some aspects of the present disclosure will be described in more detail below. Each of the example VFC circuit can be used as the VFC circuit 130 in FIGS. 1A and 1B, or be used as part of the VFC circuit 130 in FIGS. 1A and 1B.

Figure 2:
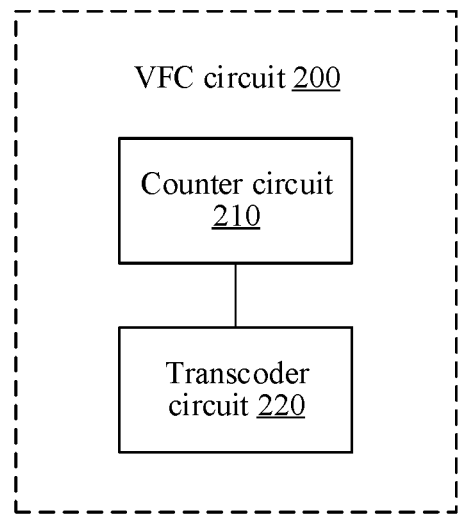
FIG. 2 is a block diagram of an example verify failbit count (VFC) circuit according to some aspects of the present disclosure.

FIG. 2 is a block diagram of an example VFC circuit 200 according to some aspects of the present disclosure. As shown in FIG. 2, the VFC circuit 200 includes a counter circuit 210 and a transcoder circuit 220 coupled to each other. The counter circuit 210 can be coupled to a buffer circuit, such as the buffer circuit 120, that stores (buffers/latches) verification results. According to some aspects of the present disclosure, the counter circuit 210 can be a digital counter circuit, i.e., a counter circuit that counts logic 1's from the buffer circuit, rather than relying on currents associated with the buffer circuit to determine whether a bit is pass or fail. In some implementations, the counter circuit 210 includes one or more counters each coupled to one or more buffers, such as page buffers, of the buffer circuit. Each of the one or more counters can be, e.g., a 4-bit counter or an 8-bit counter. The transcoder circuit 220 can also include one or more transcoders each coupled to one of the one or more counters of the counter circuit 210. In some implementations, the number of counters in the counter circuit 210 can be the same as the number of transcoders in the transcoder circuit 220, and the transcoders correspond to the counters in a one-to-one correspondence.

According to some aspects of the present disclosure, each counter can receive the verification results (e.g., with 0 representing pass bit and 1 representing fail bit) from the one or more buffers coupled to the counter, and sort the fail bit information in unary format (similar to thermometer code). Each transcoder can receive the count result (number of fail bits) in unary format (i.e., the count result as a unary code) from the corresponding counter coupled thereto, and transcode the count result from unary format to binary format (i.e., the transcoded result as a binary code). The detailed process will be described later in connection with specific examples.

Figure 3:
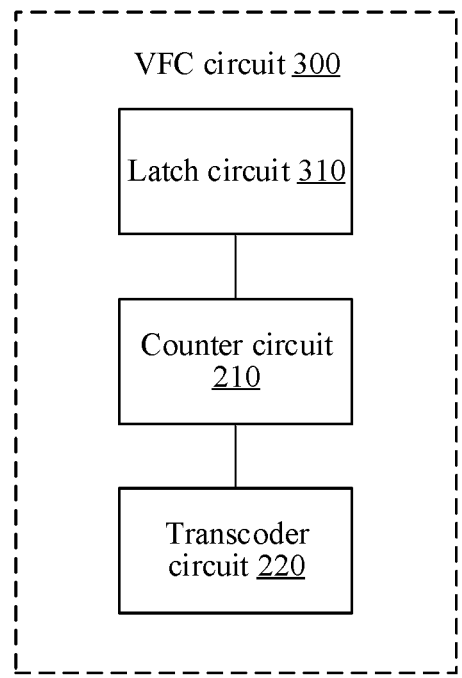
FIG. 3 is a block diagram of another example VFC circuit according to some aspects of the present disclosure.

In some implementations, the counter circuit 210 of the VFC circuit is coupled to the buffer circuit directly and takes the verification results directly from the buffers in the buffer circuit. In some other implementations, the VFC circuit can further include a latch circuit coupled between the counter circuit and the buffer circuit. FIG. 3 is a block diagram of another example VFC circuit 300 according to some aspects of the present disclosure. As shown in FIG. 3, the VFC circuit 300 includes the counter circuit 210, the transcoder circuit 220, and a latch circuit 310 coupled to the counter circuit 210. The latch circuit 310 can include one or more latches each corresponding to and coupled to one buffer (such as one page buffer) in the buffer circuit, and configured to latch the verification result in the corresponding buffer. With the latch circuit 310 being added to the VFC circuit, the buffers in the buffer circuit can transfer the verification results from a verification operation to the latches in the latch circuit 310, and be released and get ready for the next round of verification operation. Therefore, the buffers do not have to wait until the VFC circuit finishes counting then be released to get ready for buffering further verification results. Accordingly, the efficiency of the entire device can be improved.

Figure 4:
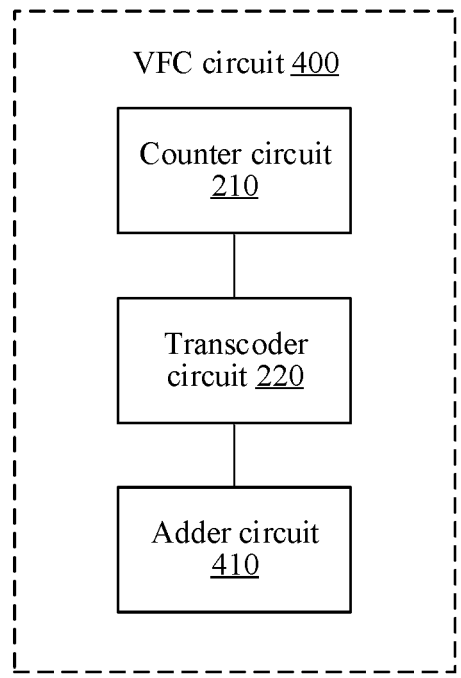
FIG. 4 is a block diagram of another example VFC circuit according to some aspects of the present disclosure.

FIG. 4 is a block diagram of another example VFC circuit 400 according to some aspects of the present disclosure. As shown in FIG. 4, the VFC circuit 400 includes the counter circuit 210, the transcoder circuit 220, and an adder circuit 410. In the example shown in FIG. 4, the counter circuit 210 includes a plurality of counters and, correspondingly, the transcoder circuit 220 includes a plurality of transcoders each coupled to one counter and configured to transcode the unary code from the one counter to a binary code. The adder circuit 410 is configured to sum up the outputs from the plurality of transcoders, and includes one or more adders. The number of adders in and the configuration of the adder circuit 410 can depend on, e.g., the number of the counters (and hence the number of transcoders). For example, the adder circuit 410 can include one adder configured to add outputs from two transcoders. As another example, the adder circuit 410 can include a plurality of adders configured in a multi-level configuration, i.e., arranged in a plurality of levels. Each adder in the first level of the multi-level configuration can be configured to add outputs from two transcoders. Further, each adder in a subsequent level of the multi-level configuration can be configured to add outputs from two adders in a previous level, or to add the output from one adder in a previous level and the output from one transcoder. For example, the counter circuit 210 includes four counters and correspondingly the transcoder circuit 220 includes four transcoders. In this scenario, the adder circuit 410 can include three adders, with two adders in the first level each configured to add outputs from two transcoders and one adder in the second level configured to add outputs from the two adders in the first level. As another example, the counter circuit 210 includes three counters and correspondingly the transcoder circuit 220 includes three transcoders. In this scenario, the adder circuit 410 can include two adders, with one adder in the first level configured to add outputs from two transcoders and one adder in the second level configured to add the output from the adder in the first level and the output from the third transcoder.

For example, the counter circuit 210 can include four counters and correspondingly the transcoder circuit 220 can include four transcoders. In this example, the adder circuit 410 can include three adders with two adders in the first level and one adder in the second level. After one verification operation, each counter can summarize the fail bits from corresponding buffers into a unary code. Each transcoder can transcode the unary code output from the corresponding counter into a corresponding binary code. Each adder in the first level can add the binary codes from two transcoders coupled thereto to obtain a binary sum (an intermediate sum) of the two binary codes. The adder in the second level can add the binary sums (intermediate sums) from the two adders in the first level to obtain a larger binary sum. The adder circuit 410 can output the larger binary sum (sum result) as the failbit count of corresponding part of the memory cell array during this verification operation.

Figure 5:
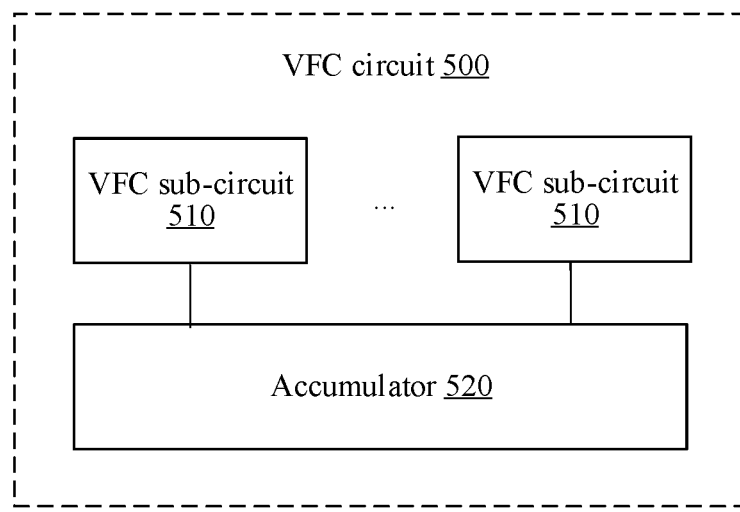
FIG. 5 is a block diagram of another example VFC circuit according to some aspects of the present disclosure.

FIG. 5 is a block diagram of another example VFC circuit 500 according to some aspects of the present disclosure. As shown in FIG. 5, the VFC circuit 500 includes a plurality of VFC sub-circuits 510 coupled to an accumulator 520. Each VFC sub-circuit 510 can, e.g., have a structure same as or similar to the VFC circuit 200 shown in FIG. 2, the VFC circuit 300 shown in FIG. 3, or the VFC circuit 400 shown in FIG. 4. The accumulator 520 is configured to accumulate the final binary sums output from the plurality of VFC sub-circuits 510, each of which can be obtained by, e.g., the adder circuit 410 of the corresponding VFC sub-circuit 510 as described above. By accumulating the final binary sums from the plurality of VFC sub-circuits 510, the accumulator 520 can obtain the total count of the failures in memory cells during the verification operation. In some implementations, the memory device has one accumulator 520 and hence the one accumulator 520 can output the total count of fail bits of the entire memory device.

Figure 6:
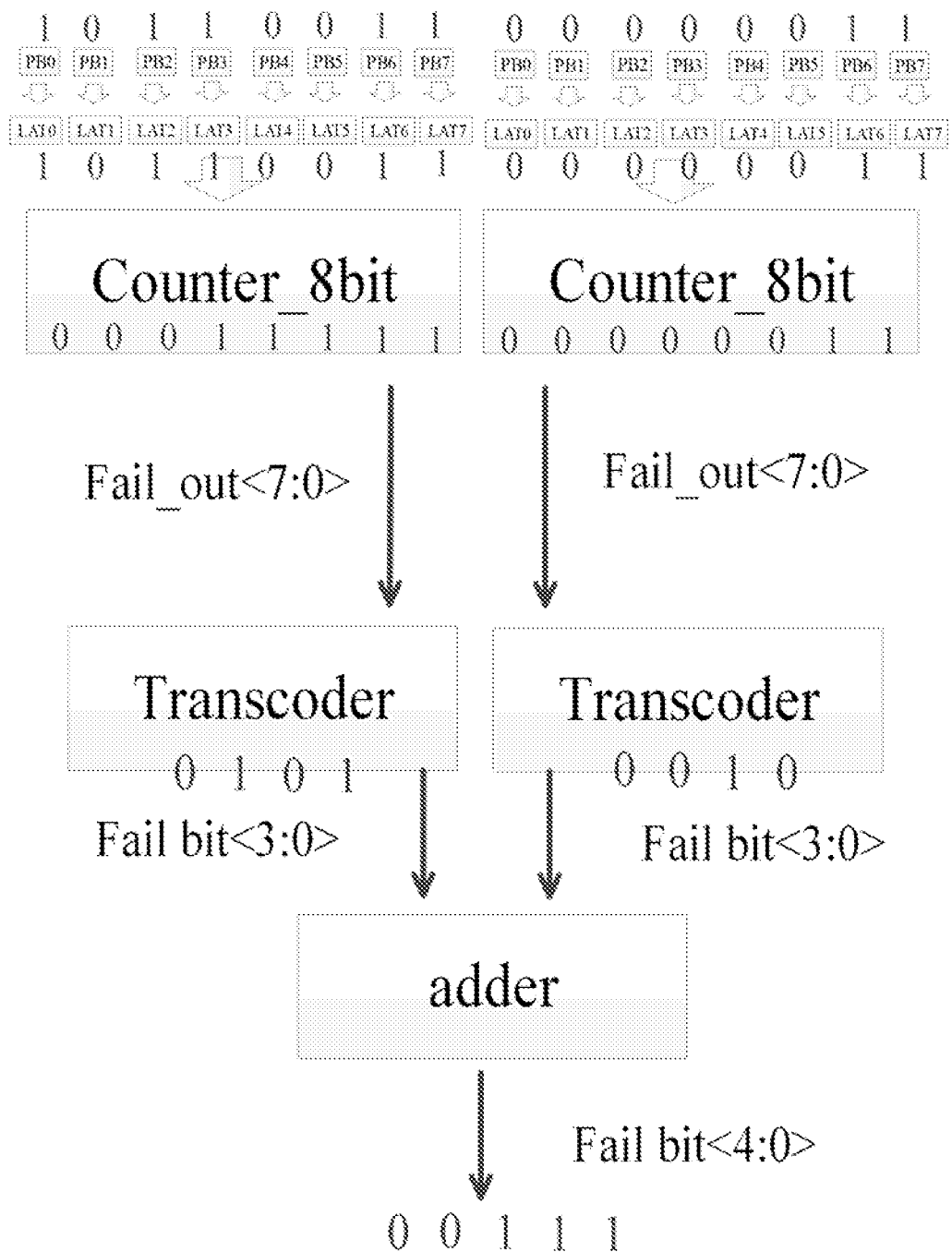
FIG. 6 is a block diagram showing operation of a portion of an example VFC circuit according to some aspects of the present disclosure.

FIG. 6 is a block diagram showing operation of a portion of an example VFC circuit according to some aspects of the present disclosure. The example VFC circuit shown in FIG. 6 includes two 8-bit counters, two transcoders, and a 4-bit adder. As shown in FIG. 6, the VFC circuit further includes sixteen latches divided into two groups each including eight latches coupled to one of the two 8-bit counters. The sixteen latches are coupled to sixteen page buffers, respectively, and configured to latch the bit data from corresponding page buffers.

As shown in FIG. 6, the sixteen page buffers output 16 bits each being 0 (representing a pass bit) or 1 (representing a fail bit). The 16 bits are divided into two groups each including 8 bits. Specifically, as shown in FIG. 6, the first group of 8 bits includes 10110011 (i.e., five of the eight bits are fail bits), and the second group of 8 bits includes 00000011 (i.e., two of the eight bits are fail bits).

As shown in FIG. 6, the 16 bits are passed to and latched by the sixteen latches. One 8-bit counter counts the number of fail bits in the first group and sorts them as 00011111 in the unary format, and another 8-bit counter counts the number of fail bits in the second group and sorts them as 00000011 in the unary format. Further, one transcoder transcodes the number of fail bits in the first group from the unary format (i.e., 00011111) to the binary format (i.e., 0101), and another transcoder transcodes the number of fail bits in the second group from the unary format (i.e., 00000011) to the binary format (i.e., 0010). The 4-bit adder adds the number of fail bits in the first group and the number of fail bits in the second group, both in the binary format, to obtain a 5-bit binary number 00111, which represents that the total number of fail bits from the sixteen page buffers is seven.

Figure 7:
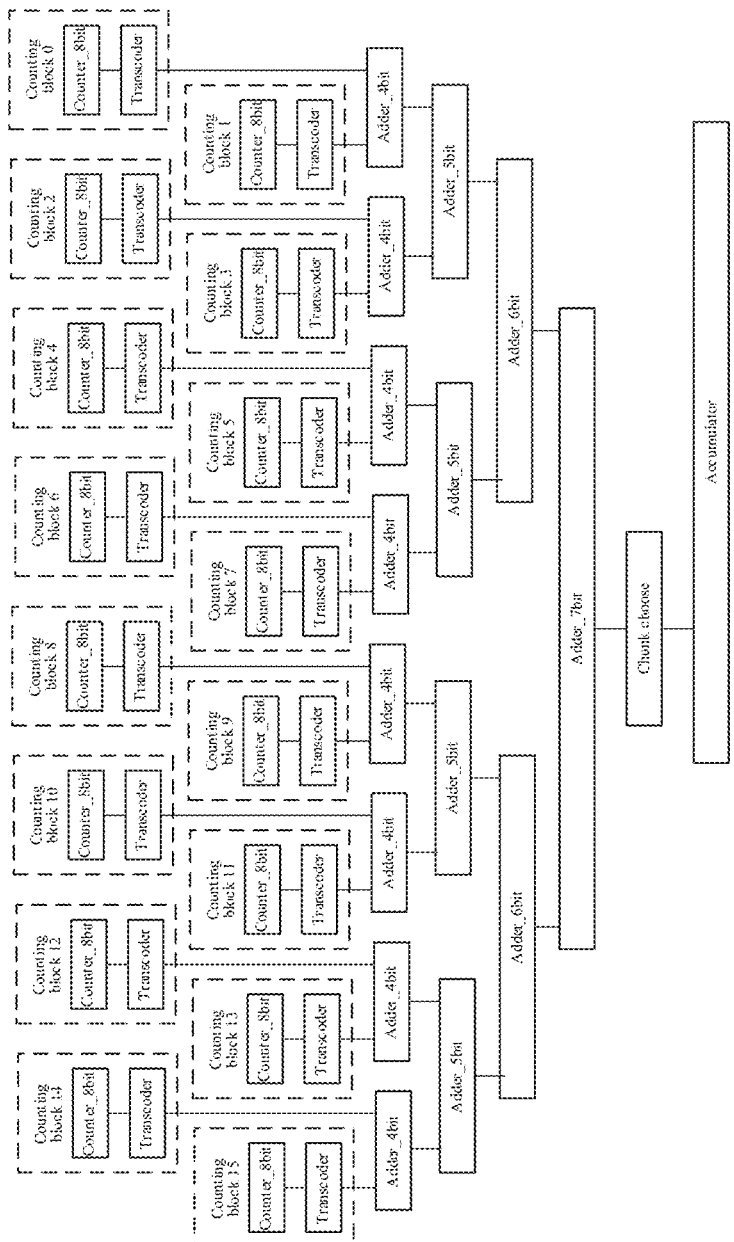
FIG. 7 is a block diagram showing operation of a portion of another example VFC circuit according to some aspects of the present disclosure.

FIG. 7 is a block diagram showing operation of a portion of another example VFC circuit according to some aspects of the present disclosure. In the example shown in FIG. 7, the VFC circuit includes sixteen counting blocks (indicated by the dashed frame in the figure), a plurality of adders to add the numbers counted by the sixteen counting blocks to obtain a sum result, and an accumulator to accumulate the sum result. FIG. 7 shows sixteen counting blocks as an example. The number of counting blocks can be determined according to, e.g., a size of the memory cell array and how the memory cell array is divided. The sixteen counting blocks can be considered a counting group. The VFC circuit can include a plurality of counting groups each configured to count fail bits for a different part of the memory cell array and output the count result to the accumulator. In some implementations, multiple counting groups can be further grouped into a larger group. The configuration of the VFC circuit and hierarchy of the counting blocks/groups can be determined according to the structure and scale of the memory cell array. The count results from all counting blocks/groups can eventually be output to the accumulator for the accumulator to obtain a final count result for the entire memory device.

As shown in FIG. 7, two counting blocks and one 4-bit adder form a counting unit having a similar structure as that shown in FIG. 6 (latches not shown in FIG. 7). The operation of the counting unit is similar to that of the portion shown in FIG. 6 described above. Each counting unit outputs a 5-bit count result to the next level of adders. As shown in FIG. 7, the adders in the counting units are coupled directly to the corresponding transcoders and hence can be considered the first level of adders in the VFC circuit. In the example shown in FIG. 7, the adders in the first level are 4-bit adders. Thus, the adders in the second level are 5-bit adders each configured to add the 5-bit count results from two corresponding 4-bit adders in the first level, and output a 6-bit count result. Similarly, the adders in the third level are 6-bit adders each coupled to two 5-bit counters in the second level and configured to add the 6-bit count results from the two corresponding 5-bit adders to output a 7-bit count result. In the example shown in FIG. 7, each counting block includes one 7-bit adder in the fourth level, which is coupled to the two 6-bit adders in the third level and configured to add the 7-bit count results from the two 6-bit adders to output an 8-bit count result.

As shown in FIG. 7, the VFC circuit further includes a chunk choose circuit to aggregate the results from the sixteen counting blocks. The VFC circuit accumulates sixteen times in each verification operation.

The number of counting blocks, the number of levels of adders, and the bit number of the counters etc., in FIG. 7 are just examples and for illustrative purposes only. In other embodiments, different numbers than those shown in FIG. 7 can be adopted.

Figure 8:
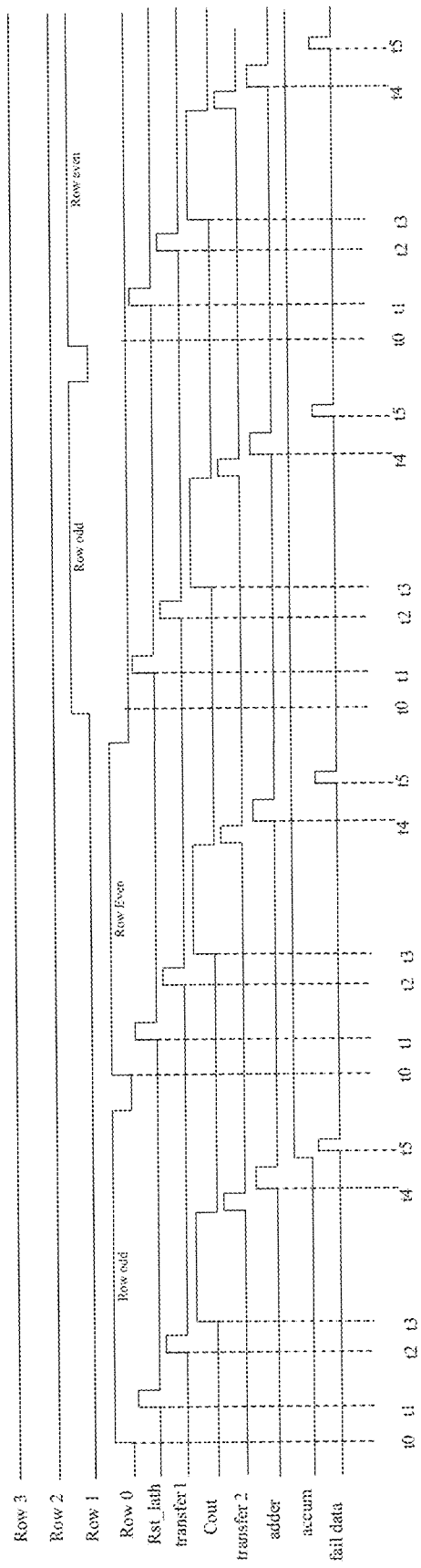
FIG. 8 is a schematic example timing diagram during the operation of the VFC circuit shown in FIG. 7.

FIG. 8 is a schematic example timing diagram during the operation of the VFC circuit shown in FIG. 7. According to some aspects of the present disclosure, the verification operation can include a plurality of cycles and can be performed on the memory cells row by row. In the example shown in FIG. 8, four rows are depicted. Within each row of memory cells, even bits and odd bits can be verified separately. As shown in FIG. 8, timing sequence of signals for the even bits of a row is repeated for the odd bits of the same row. Similarly, timing sequence of signals for each row is repeated. For illustrative purposes, the verification operations for two rows (row 0 and row 1) are shown in FIG. 8, during which the other two rows (row 2 and row 3) remain idle. Further, timing sequence for the even bits of Row 0 is described in detail below. Timing sequence for the odd bits of Row 0 or for other rows is similar. The timing diagram in FIG. 8 is marked with four groups of time points t0-t5. The same time point reference character in FIG. 8 does not necessarily mean the actual same time point, but means corresponding time points in different period. For example, the four time points labeled with to in FIG. 8 are four different time points in four different periods but correspond to each other.

As show in FIG. 8, at t0, the VFC circuit is enabled and signal "Row 0" transitions from low to high to select an odd half of row 0. At t1, signal "Rst_lath" transitions from low to high to reset all the latches of the VFC circuit to prepare them for data transfer. Signal "Rst_lath" can be a pulse signal and can then transition from high to low. At t2, signal "transfer 1" transitions from low to high to transfer the status of L latches in the page buffers (i.e., bits stored in the page buffers) to the latches of the VFC circuit, to prepare for counting. Signal "transfer 1" can be a pulse signal and can then transition from high to low. Then, at t3, signal "Cout" transitions from low to high to enable the counters in FIG. 7 to count the number of fail bits and sort them to be in a unary format. Signal "Cout" remains high for a certain period of time for the counters to finish counting, and then transitions from high to low, at about what time, signal "transfer 2" transitions from low to high to enable the transcoders in FIG. 7 to transcode the number of fail bits in the unary format to the number of fail bits in a binary format. Signal "transfer" can be a pulse signal, and can then transition from high to low. At t4, signal "adder" transitions from low to high to enable the adders in FIG. 7 to aggregate the numbers of fail bits. After signal "adder" transitions from high to low, signal "accum" transitions from low to high (and remains high) to enable the accumulator in FIG. 7 to be ready for accumulating. From t5, failbit count results from the counting blocks in FIG. 7 are accumulated. Since there are sixteen counting blocks for odd or even bits of each row (as indicated in FIG. 7), failbit count accumulation is performed sixteen times for the odd bits of Row 0. After the failbit count results from all sixteen blocks have been accumulated, signal "Row 0" transitions from high to low to finish the current cycle of counting for odd bits of Row 0. In the example shown in FIG. 8, signal "accum" remains high even after signal "Row 0" goes low, and continues to be high through the subsequent cycles for even bits of Row 0 and other rows. That is, the accumulator is always enabled for accumulation. In some other implementations, the accumulator can be disabled after the current cycle is completed and enabled again before the accumulation starts in subsequent cycles.

Figure 9A:
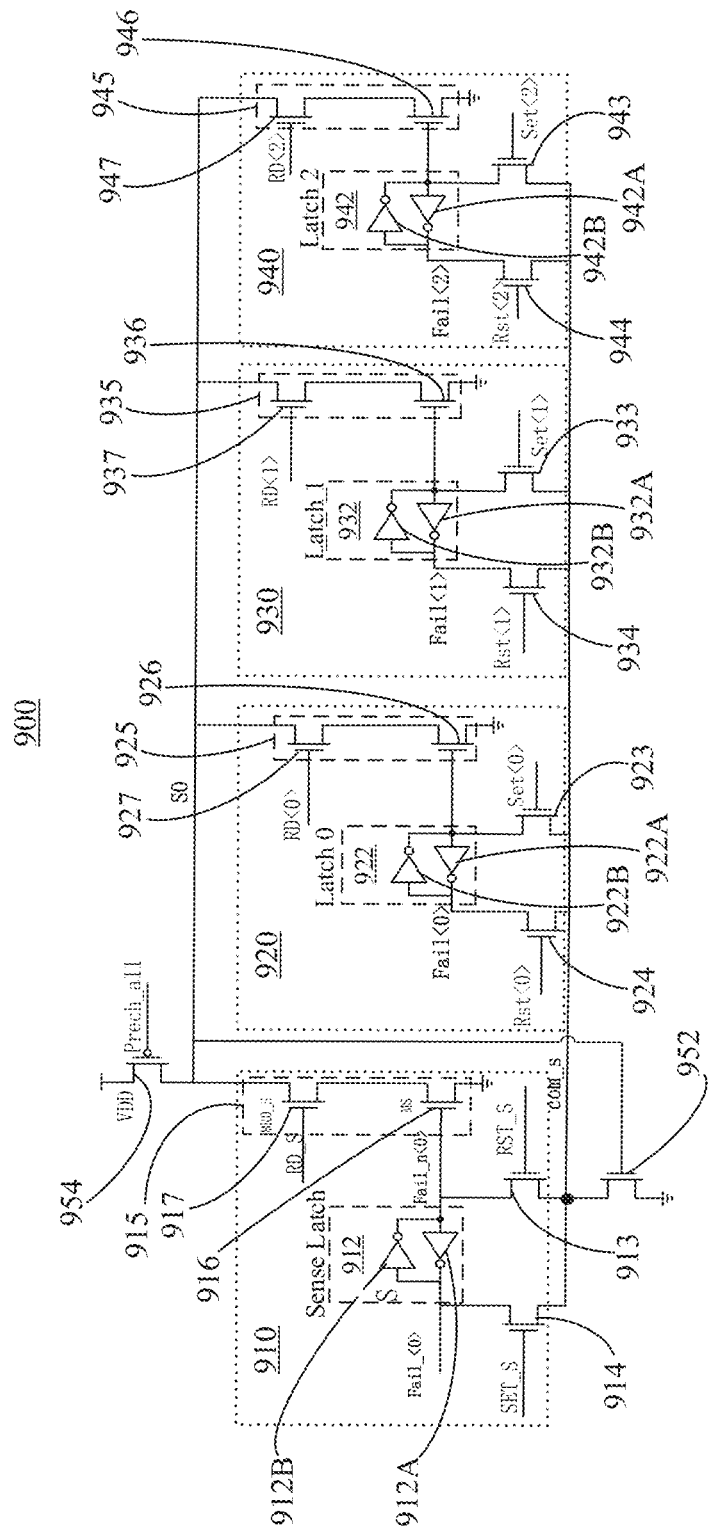
FIG. 9A is a schematic circuit diagram of a portion of an example counter according to some aspects of the present disclosure.

FIG. 9A is a schematic circuit diagram of a portion of an example counter 900 according to some aspects of the present disclosure. The example counter 900 shown in FIG. 9A is a 4-bit counter including four latches. The latches included in the counter are also referred to as counter latches (first counter latch (Sense Latch), second counter latch (Latch 0), third counter latch (Latch 1), and fourth counter latch (Latch 2) from left to right as shown in FIG. 9A). The counter latches can be different from the latches used to store the pass/fail data of the verification operation before being sent to the counter for counting.

In some implementations, as shown in FIG. 9A, the counter 900 includes a plurality of counter stages configured to sense, store, and count fail bits. The plurality of counter stages include a first counter stage 910, a second counter stage 920, a third counter stage 930, and a fourth counter stage 940. The first counter stage 910 is also referred to as a sense stage, and the second to fourth counter stages 920, 930, and 940 are also referred to as storage stages. As shown in FIG. 9A, the plurality of counter stages 910-940 have a first common terminal and a second common terminal, i.e., the plurality of counter stages 910-940 are coupled to each other in parallel between the first common terminal and the second common terminal. The first common terminal is coupled to a common ground transistor 952 (also referred to as a "ground transistor"), and the second common terminal is coupled to a power-supply transistor 954 (also referred to as a "control transistor" or "switch transistor"). In some implementations, the common ground transistor 952 can be configured to couple the first common terminal to ground and the power-supply transistor 954 can be configured to couple the second common terminal to a power source. The common ground transistor 952 can be, for example, an N-channel transistor, such as an N-channel metal-on-semiconductor (NMOS) transistor. The power-supply transistor 954 can be, for example, a P-channel transistor, such as a PMOS transistor.

As shown in FIG. 9A, the first counter stage 910 includes a first counter latch 912, the second counter stage 920 includes a second counter latch 922, the third counter stage 930 includes a third counter latch 932, and the fourth counter stage 940 includes a fourth counter latch 942. As shown in FIG. 9A, the first counter latch includes a first inverter 912A and a second inverter 912B, where an output of the first inverter 912A is coupled to an input of the second inverter 912B, and an output of the second inverter 912B is coupled to an input of the first inverter 912A. A first terminal of the first counter latch 912 coupled to the input of the first inverter 912A and the output of the second inverter 912B can be considered a complementary output of the first counter latch 912, and a second terminal of the counter latch 912 coupled to the output of the first inverter 912A and the input of the second inverter 912B can be considered an output of the first counter latch 912. Similarly, each of the second counter latch 922, the third counter latch 932, and the fourth counter latch 942 each includes a first inverter (922A, 932A, or 942A) and a second inverter (922B, 932B, or 942B) coupled to each other, as shown in FIG. 9A.

As shown in FIG. 9A, each of the first counter stage 910, the second counter stage 920, the third counter stage 930, and the fourth counter stage 940 includes a first transistor (913, 923, 933, or 943) and a second transistor (914, 924, 934, or 944) coupled between the corresponding counter latch (912, 922, 932, or 942) and the common ground transistor 952. The first transistor (913, 923, 933, or 943) and the second transistor (914, 924, 934, or 944) in a counter stage (910, 920, 930, or 940) form a transistor pair. Further, each of the first counter stage 910, the second counter stage 920, the third counter stage 930, and the fourth counter stage 940 includes a transistor string (915, 925, 935, or 945) coupled between the corresponding counter latch (912, 922, 932, or 942) and the power-supply transistor 954. Each of the transistor strings 915, 925, 935, and 945 includes a third transistor (916, 926, 936, or 946, also referred to as a "pass transistor") and a fourth transistor (917, 927, 937, or 947) coupled to each other. The first transistors 913, 923, 933, and 943, the second transistors 914, 924, 934, and 944, the third transistors 916, 926, 936, and 946, and the fourth transistors 917, 927, 937, and 947 can be N-channel transistors, such as NMOS transistors.

As shown in FIG. 9A, the connections between various components in different counter stages are similar. The connections in the first counter stage 910 will be described below, and components in other counter stages are similarly connected.

As shown in FIG. 9A, a drain electrode of the first transistor 913 is coupled to the input of the first inverter 912A and the output of the second inverter 912B (i.e., the complementary output of the first counter latch 912). A drain electrode of the second transistor 914 is coupled to the output of the first inverter 912A and the input of the second inverter 912B (i.e., the output of the first counter latch 912). Source electrodes of the first transistor 913 and the second transistor 914 are coupled together, and further coupled to a drain electrode of the common ground transistor 952. A source electrode of the common ground transistor is coupled to the ground.

Further, as shown in FIG. 9A, the complementary output of the first counter latch 912 is coupled to a gate electrode the third transistor 916. A drain electrode of the third transistor 916 is coupled to a source electrode of the fourth transistor 917, and a source electrode of the third transistor 916 is coupled to the ground. A drain electrode of the fourth transistor 917 is coupled to the drain electrode of the power-supply transistor 954.

Further, as shown in FIG. 9A, a gate electrode of the common ground transistor 952 is also coupled to the drain electrode of the power-supply transistor 954. A source electrode of the power-supply transistor 954 is coupled to a power supply.

In the example shown in FIG. 9A, the counter includes one common ground transistor 952 coupled to all the counter stages 910-940. In some other implementations, each of the counter stages of a counter can be coupled to a corresponding ground transistor. In such implementations, the gate electrode of each ground transistor can be coupled to the drain electrode of the power-supply transistor 954, and the drain electrode of each ground transistor can be coupled to the corresponding counter stage. In some implementations, the counter stages can be coupled to a common node via corresponding ground transistors, with a source electrode of each ground transistor being coupled to the common node. The common node can be, e.g., the ground. For example, a counter having four counter stages, such as the counter shown in FIG. 9A, can include four ground transistors, and each of the four counter stages is coupled to common node, such as ground, via a corresponding one of the four ground transistors. In some implementations, the drain electrodes of the plurality of ground transistors can be coupled together.

In this disclosure, one of the source and drain electrodes of a transistor is also referred to as a "first source/drain (S/D) electrode" of the transistor, and the other one of the source and drain electrodes of the transistor is also referred to as a "second S/D electrode" of the transistor.

As shown in FIG. 9A, a gate electrode of the power-supply transistor 954 is configured to receive a first control signal (a precharge signal). The first terminal of the first counter latch 912 (Sense Latch) is configured to receive a pass/fail signal of a verification operation, and the second terminal of the first counter latch 912 is configured to store the complementary of the pass/fail signal. That is, the pass-fail signal is latched in the first counter latch.

In the first counter stage 910, a gate electrode of the fourth transistor 917 is configured to receive a second control signal for the first counter stage 910. Similarly, in each of the second to fourth counter stages 920, 930, and 940, a gate electrode of the fourth transistor 927, 937, or 947 is configured to receive a corresponding second control signal for the corresponding counter stage.

As mentioned above and shown in FIG. 9A. the components and connections thereof in all four counter stages 910, 920, 930, and 940 are similar to each other, including the first transistor (913, 923, 933, or 943) and the second transistor (914, 924, 934, or 944). However, they can function differently. As shown in FIG. 9A, in the first counter stage 910, a gate of the first transistor 913 is configured to receive a reset signal for the first counter latch 912, and hence the first transistor 913 can serve as a reset transistor for the first counter latch 912; and correspondingly, a gate of the second transistor 914 is configured to receive a set signal for the first counter latch 912, and hence the second transistor 914 can serve as a set transistor for the first counter latch 912. However, in each of the second to fourth counter stages 920, 930, and 940, the gate of the first transistor (923, 933, or 943) is configured to receive a set signal for the corresponding counter latch, and hence the first transistor (923, 933, or 943) can serve as the set transistor for the corresponding counter latch; and correspondingly, the gate of the second transistor (924, 934, or 944) is configured to receive a reset signal for the corresponding counter latch, and hence the second transistor (924, 934, or 944) can serve as the reset transistor for the corresponding counter latch.

In some implementations, the first control signal, the second control signals for various counter stages, and the reset and set signals for various counter stages can be generated and controlled by a controller to facilitate the counter to count, in the unary format, the number of fail bits provided by the buffer circuit. The controller can be, for example, the control logic 140 described above or the memory controllers 2006, 2104, and 2204, or the processor 2313 described below.

In the example counter 900 shown in FIG. 9A. four counter stages, and hence four counter latches, are included. In some other implementations, more or less stages (and hence more or less latches and associated components) can be included. For example, four more stages can be added to the example counter shown in FIG. 9A to extend the counter into an 8-bit counter, which can be used as the 8-bit counter in the examples shown in FIGS. 6 and 7.

Figure 9B:
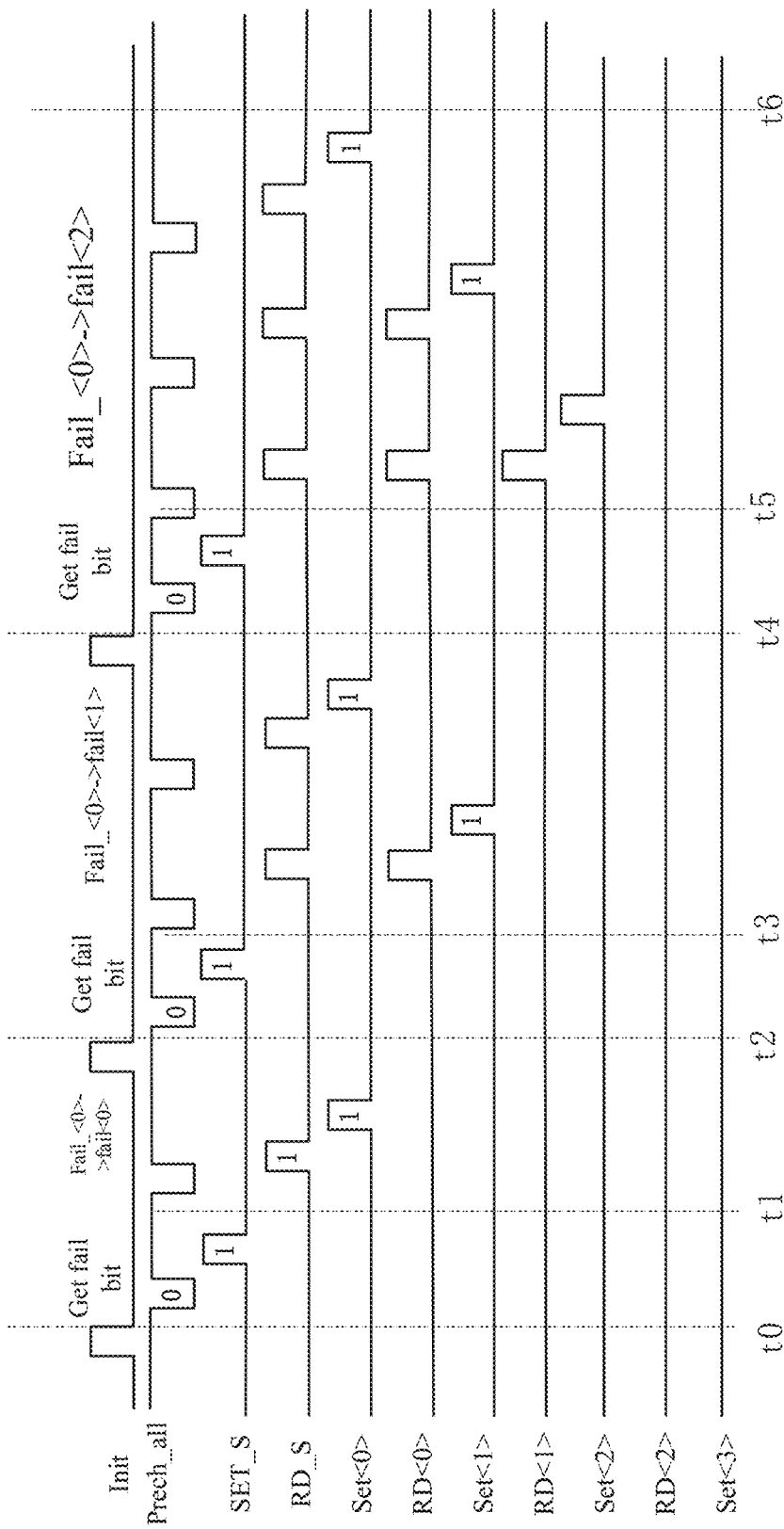
FIG. 9B is a schematic example timing diagram for the counter shown in FIG. 9A.

FIG. 9B is a schematic example timing diagram for the example counter 900 shown in FIG. 9A, showing example changes of various signals for controlling the operation of the counter 900. An example of the control and operation of the counter 900 is described below with reference to FIGS. 9A and 9B.

As shown in FIG. 9A, the counter includes Sense Latch, Latch 0, Latch 1, and Latch 2, arranged from left to right, and coupled via a plurality of transistors to form a circuit. In the example shown in FIG. 9A, the transistors are all NMOS transistors, except for the power-supply transistor 954, which is a PMOS transistor. As described above, Sense Latch can be configured to receive and store the bit from a corresponding buffer. In some implementations, if the received bit is a fail bit, Sense Latch can pass the fail bit to other latches.

As shown in FIG. 9A, Sense Latch, Latch 0, Latch 1, and Latch 2 can be set by control signals SET_S, Set<0>, Set<1>, and Set<2>, respectively, and be reset by control signals RST_S, Rst<0>, Rst<1>, and Rst<2>, respectively. After initialization, when a first fail bit is detected, the first fail bit is transmitted to and stored in Latch 0, and no action is performed on Latch 1 and Latch 2. When a second fail bit is detected, the second fail bit is transmitted to and stored in Latch 1, and no action is performed on Latch 2. When a third fail bit is detected, the third fail bit is transmitted to and stored in Latch 3. According to some aspects of the present disclosure, there is no need to toggle all the counter latches when a fail bit is received. As a result, time for counting the failbit number can be reduced, especially when the number of counter latches is large.

For example, a pass/fail signal from the corresponding buffer can be applied to node Fail_<0>. When the pass/fail signal is not a fail bit, node Fail_<0> has a value of logic 0. On the other hand, when the pass/fail signal is a fail bit, node Fail_<0> has a value of logic 1, i.e., a fail bit is sensed. When node Fail_<0> senses a logic 1 (i.e., Sense Latch senses a fail bit), if Fail<0> has a logic 0, Fail<0> changes from logic 0 to logic 1 (i.e., Latch 0 stores the sensed fail bit); if Fail<0> already had a logic 1 and Fail<1> has a logic 0, Fail<1> changes from logic 0 to logic 1 (i.e., Latch 1 stores the sensed fail bit); and if both Fail<0> and Fail<1> already had a logic 1 and Fail<2> has a logic 0, Fail<2> changes from logic 0 to the logic 1 (i.e., Latch 2 stores the sensed fail bit); and so on so forth. If any of the node in this chain had a value of logic 0, further checking on the right-side latches will not occur.

As shown in FIG. 9B, signal Init (not shown in FIG. 9A) initializes the counter 900 at a beginning of each cycle to receive a fail bit. In this case, three cycles are shown in FIG. 9B. In FIG. 9B, timing sequences of control signals Init, prech_all, SET_S, RD_S, Set<0>, RD<0>, Set<1>, RD<1>, Set<2>, and RD<2> are shown, which achieve propagation of the fail bits to the counter latches.

For example, a first fail bit received by the counter 900 is stored to node Fail<0> as follows. Node Fail<0> is initialized to logic 0 through signal Rst<0> and signal prech_all. When signal prech_all is set to logic 0, the power-supply transistor 954 is turned on and node S0 (shown in FIG. 9A) is brought to high level (e.g., VDD). When signal prech_all is set to logic 1, the power-supply transistor 954 is turned off and node S0 is floated and maintains the high level.

When the first fail bit is sensed by Sense Latch, Fail_<0> becomes logic 1. Then, signal RD_S is set to logic 1 to read the value stored in Sense Latch, e.g., at Fail_<0>. At this time, Fail_<0> has a value of logic 1, and hence signal Set<0> is set to logic 1 to set the value at Fail<0> to logic 1, so as to store the first fail bit to Latch 0.

When a second fail bit is received by the counter 900, i.e., sensed by Sense Latch, Fail_<0> is logic 1. Similarly, signal RD_S is set to logic 1 to read the value stored in Sense Latch, e.g., at Fail_<0>. At this time, Fail_<0> has a value of logic 1. Rd<0> is set to logic 1 to read the value stored in Latch 0, i.e., the value at Fail<0>. If Fail<0> has a value of logic 1, i.e., Latch 0 already stores a fail bit, then signal Set<1> is set to logic 1 to set the value at Fail<1> to logic 1, so as to store the second fail bit to Latch 1.

When a third fail bit is received by the counter 900, i.e., sensed by Sense Latch, Fail_<0> is logic 1. Similarly, signal RD_S is set to logic 1 to read the value stored in Sense Latch, e.g., at Fail_<0>. At this time, Fail_<0> has a value of logic 1. Rd<0> is set to logic 1 to read the value stored in Latch 0, i.e., the value at Fail<0>, and Rd<1> is set to logic 1 to read the value stored in Latch 1, i.e., the value at Fail<1>. If both Fail<0> and Fail<1> have a value of logic 1, i.e., both Latch 0 and Latch 1 already store fail bits, then signal Set<2> is set to logic 1 to set the value at Fail<2> to logic 1, so as to store the third fail bit to Latch 2.

As such, the fail bits are counted and sorted in the unary format. It can take 27 pulses to count three fail bits.

Figure 10A:
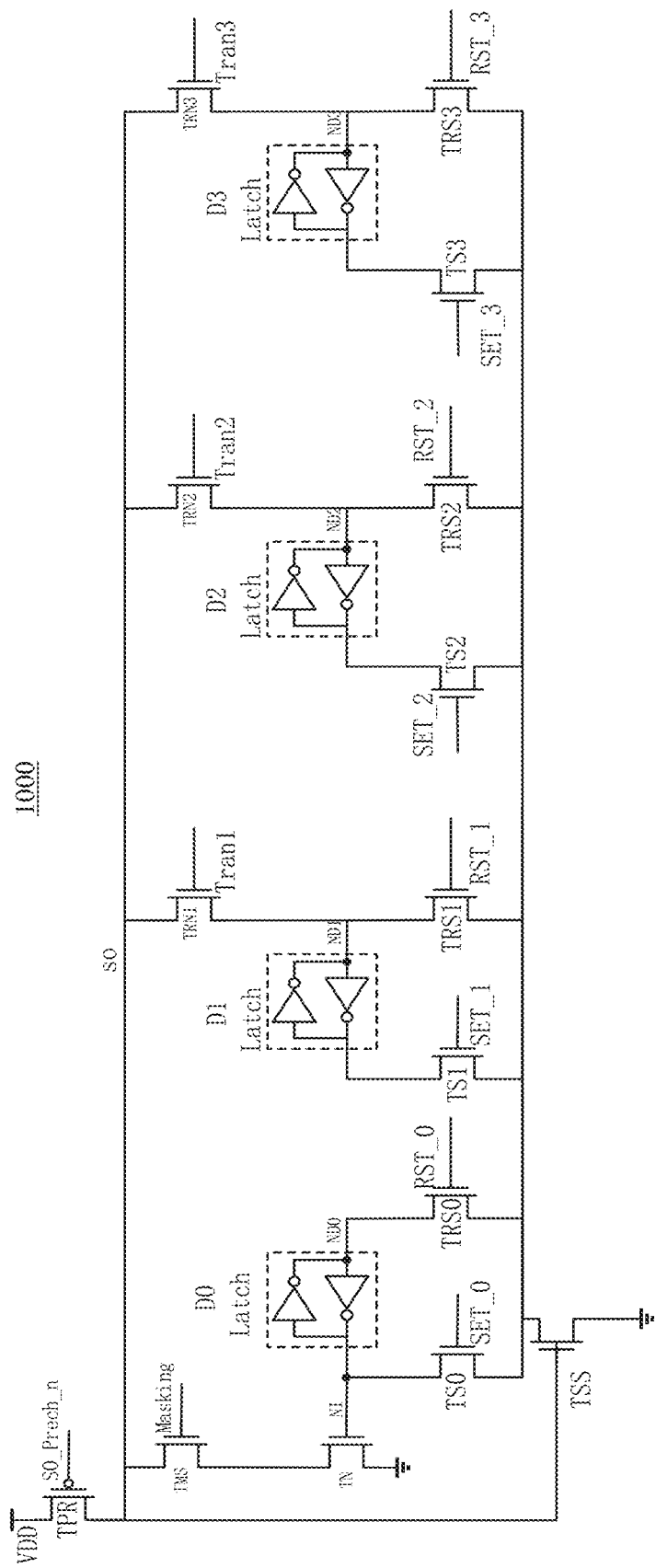
FIG. 10A is a schematic circuit diagram of a portion of another example counter according to some aspects of the present disclosure.
Figure 10B:
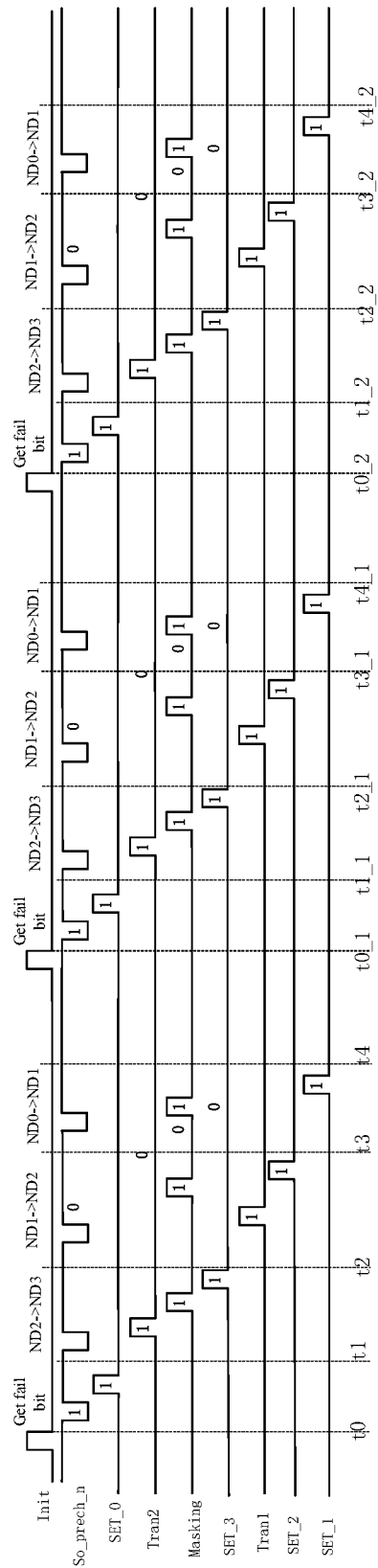
FIG. 10B is a schematic example timing diagram for the counter shown in FIG. 10A.

FIG. 10A is a schematic circuit diagram of a portion of another example counter 1000 consistent with the disclosure. The example counter 1000 shown in FIG. 10A is a four-stage counter (including four counter latches). In some other implementations, the counter can have more or less stages (i.e., more or less counter latches). For example, more stages (i.e., more counter latches) can be added to extend the counter into an 8-bit counter, which can be used as the 8-bit counter in FIGS. 6 and 7. FIG. 10B is a schematic example timing diagram for the counter 1000 shown in FIG. 10A. The operation of the counter 1000 is described below with reference to FIGS. 10A and 10B.

As shown in FIG. 10A, the counter includes four counter latches, D0 Latch, D1 Latch, D2 Latch, and D3 Latch, arranged from left to right. D0 Latch, D1 Latch, D2 Latch, and D3 Latch can be set by control signals SET_0, SET_1, SET_2, and SET_3, respectively, and be reset by control signals RST_0, RST_1, RST_2, and RST_3, respectively. After the initialization, when a fail bit is detected, it is stored in D0 Latch, a value stored in D0 Latch is transmitted to the D1 Latch, a value stored in the D1 Latch is transmitted to D2 Latch, and a value stored in the D2 Latch is transmitted to D3 Latch.

For example, a pass/fail signal provided by a buffer in FIG. 6 can be applied to node NI. When the pass/fail signal is a fail bit, a value at node NI is transmitted to node ND0, a value stored at node ND0 is transmitted to node ND1, a value stored at node ND1 is transmitted to node ND2, and a value stored at node ND2 is transmitted to node ND3.

As shown in FIG. 10B, an Init signal (not shown in FIG. 10A) initializes the counter 1000 at a beginning of each cycle to receive a fail bit. In this case, three cycles are shown in FIG. 10B. In FIG. 10B, timing sequences of control signals Init, So_prech_n, SET_0, Tran2, Masking, SET_3, Tran1, SET_2, and SET_1 to achieve propagation of the fail bits to all the counter latches. As such, the fail bits are counted in the unary format. It can take 39 pulses to count three fail bits.

Figure 11:
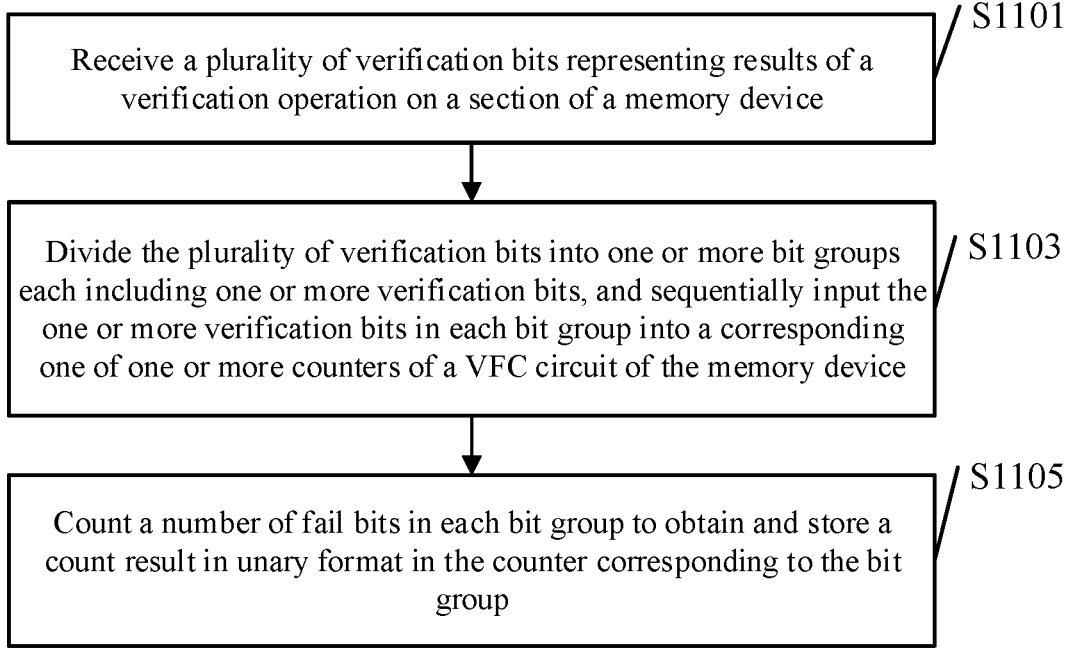
FIG. 11 is a flowchart showing an example method for counting fail bits according to some aspects of the present disclosure.

The present disclosure also provides a method for counting fail bits in a memory device. FIG. 11 is a flowchart showing an example failbit counting method 1100 according to some aspects of the present disclosure. The method 1100 can be applied to a memory device according to some aspects of the present disclosure, such as any of the example memory devices according to some aspects of the present disclosure (e.g., the memory device 100 shown in FIG. 1A or 1B). In some implementations, the method 1100 can be implemented by, e.g., a VFC circuit according to some aspects of the present disclosure, such as any of the example VFC circuits described above, under the control of a processing device, such as any of the control logic 140 described above or the example memory controllers 2006, 2104, and 2204, or the processor 2313 described below. As shown in FIG. 11, the method 1100 includes the following processes.

At S1101, a plurality of bits representing results of a verification operation performed on a section of the memory device (a section of the memory cell array of the memory device) are received. The plurality of bits representing the results of the verification operation can also be referred to as "verification bits." Each verification bit can be either a fail bit or a pass bit. The plurality of verification bits can be received by the VFC circuit.

In some implementations, the memory device is divided into one or more sections each including a plurality of memory cells. The verification operation is performed on each of the one or more sections of the memory device to verify the data stored in the memory cells, and generates the plurality of verification bits (i.e., pass/fail bits). Each verification bit can represent a verification result of a memory cell, and can be either a fail bit (indicating the memory cell fails the verification) or a pass bit (indicating the memory cell passes the verification).

At S1103, the plurality of verification bits are divided into one or more bit groups each including one or more verification bits, and the one or more verification bits in each bit group are sequentially input to a corresponding one of one or more counters of the VFC circuit. Each counter can include one or more counter stages coupled in series, and each counter stage can include a counter latch for latching a fail bit.

In some implementations, the memory device may include a substantially large number of memory cells. As such, the verification operation may generate a substantially large number of verification bits. To count the plurality of verification bits, the plurality of verification bits are divided into the plurality of bit groups each containing a smaller number of fail bits that can be more easily counted by one counter. Each counter can include one or more counter stages coupled in series. For example, each counter can include 4 or 8 counter stages and can count (latch) 4 or 8 fail bits. The number of counter stages can be equal to or smaller than the number of verification bits in a bit group. In some implementations, the number of counter stages (the number of latches) can be the same as the number of verification bits in a bit group.

At S1105, a number of fail bits in each bit group is counted to obtain and store a count result in unary format in the counter corresponding to the bit group.

In some implementations, the number of fail bits in each bit group is counted. The count result is in unary format and is stored in the counter corresponding to the bit group. For example, a bit group includes 4 verification bits, among which three are fail bits. The count result stored in the counter can be 0111, which represents number 3 in unary format.

Figure 12:
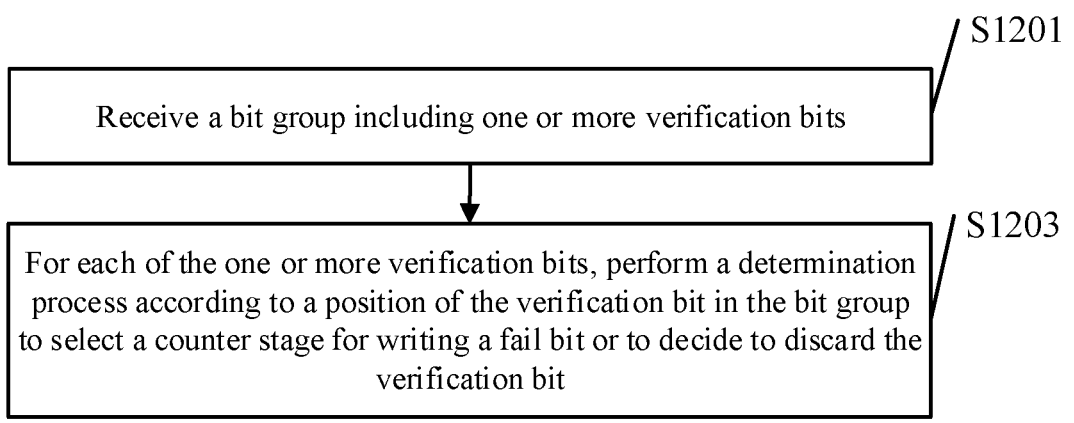
FIG. 12 is a flowchart showing an example method for obtaining and storing a count result in a counter according to some aspects of the present disclosure.

FIG. 12 is a flowchart showing an example failbit counting method 1200 for obtaining and storing a count result in a counter according to some aspects of the present disclosure. The counting method 1200 can be applied to a memory device according to some aspects of the present disclosure, such as any of the example memory devices according to some aspects of the present disclosure (e.g., the memory device 100 shown in FIG. 1). In some implementations, the method 1200 can be implemented by, e.g., a counter according to some aspects of the present disclosure, such as any of the example counters described above, under the control of a processing device, such as any of the control logic 140 described above or the example memory controllers 2006, 2104, and 2204, or the processor 2313 described below. The counting method 1200 can count the number of fail bits in a bit group to obtain and store a count result in unary format (e.g., corresponding to S1105 in the failbit counting method 1100 described above). As shown in FIG. 12, the counting method 1200 includes the following processes.

At S1201, a bit group including one or more verification bits is received. As described above, the one or more verification bits in the bit group can be received sequentially by the counter, e.g., at an input of the counter. The counter can include one or more counter stages coupled in series from the input of the counter, and each including a counter latch.

At S1203, for each of the one or more verification bits, a determination process is performed according to a position of the verification bit in the bit group to select a counter stage for writing a fail bit (i.e., which counter latch to write a fail bit into) or to decide to discard the verification bit. Specifically, if a verification bit is determined to be a fail bit, a fail bit can be written into a counter stage that is closest to the input of the counter among all available counter stages in the counter (an available counter stage refers to a counter stage that does not store a fail bit). The available counter stage closest to the input of the counter is also referred to as a "closest available counter stage." For example, if none of the counter stages in the counter stores a fail bit, then the first counter stage (counting from the input side) is the closest available counter stage. As another example, if the first counter stage and the second counter stage each stores a fail bit, then the third counter stage is the closest available counter stage.

The determination can be different for different verification bits in the bit group depending on the position of the verification bit in the bit group. The position of a verification bit in the bit group can refer to an order in which the verification bit is received by the counter among the one or more verification bits in the bit group, e.g., whether the verification bit is the first one, or the second one, etc., of the one or more verification bits received by the counter.

For example, for the first verification bit in the bit group, the determination process can include determining whether the first verification bit is a fail bit. If it is determined that the first verification bit is a fail bit, then the counter latch in the first counter stage of the counter can be selected to write a fail bit. On the other hand, if it is determined that the first verification bit is not a fail bit (i.e., is a pass bit), then the first verification bit is discarded, i.e., no writing of fail bit into any of the counter latches is performed.

Further, for an N-th verification bit (N being an integer larger than one) in the bit group, the determination process can include first determining whether the N-th verification bit is a fail bit and whether the counter latch in each of the first to the (N−1)-th counter stages already stores a fail bit. If so, then the counter latch in the N-th counter stage is selected for writing a fail bit. If not, then the determination process can further include determining whether the N-th verification bit is a fail bit and whether the counter latch in each of the first to the (N−2)-th counter stages already stores a fail bit. If so, then the counter latch in the (N−1)-th counter stage is selected for writing a fail bit. The above determination is iteratively performed with the counter latch of a last counter stage in a previous determination being precluded from a subsequent determination. This iteratively-performed determination process stops when at a certain determination, the verification bit is determined to be a fail bit and the counter latches of all the counter stages checked in this determination store a fail bit, or when a certain determination only includes checking whether the verification bit is a fail bit without checking the storage status of any counter latch. If at a certain determination, the verification bit is determined to be a fail bit and the counter latches in all the counter stages checked in this determination store a fail bit, then a counter latch in a counter stage subsequent to the checked counter stages is selected for writing a fail bit.

In summary, according to the counting method 1200 described above, pass bit(s) in a bit group will be discarded and fail bit(s) in the bit group will be sequentially written into the counter latches of the counter, producing a failbit count result in unary format.

Figure 13A:
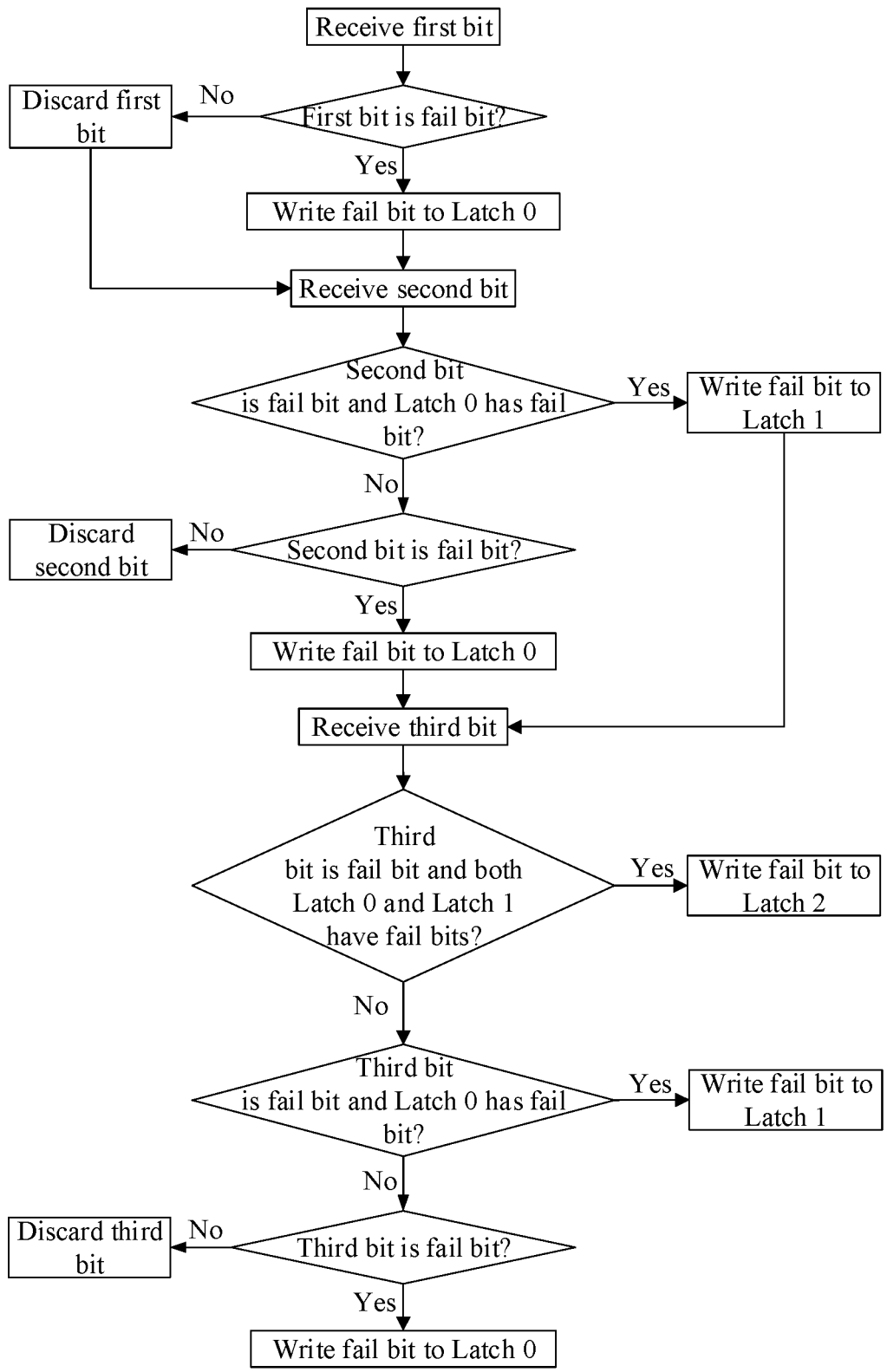
FIGS. 13A and 13B are flow charts showing examples of checking verification bits and counting fail bits applied to the counter shown in FIG. 9A.

FIG. 13A is a flow chart showing an example of checking verification bits and counting fail bits that can be applied to the counter 900 shown in FIG. 9A. In the example shown in FIG. 13A, the bit group includes three verification bits: a first verification bit, a second verification bit, and a third verification bit. Correspondingly, the counter includes three latches: a first counter latch (corresponding to Latch 0 in FIG. 9), a second counter latch (corresponding to Latch 1 in FIG. 9A), and a third counter latch (corresponding to Latch 2 in FIG. 9A). The output from the counter 900 is the number of fail bits in unary format. FIG. 13A shows three verification bits being received as an example, but the process can be scaled down to one or two verification bits, or expanded to four or more verification bits.

The counter is initialized to store no fail bit (i.e., each counter latch stores a binary value indicating not a fail bit, i.e., binary 0). As shown in FIG. 13A, after the first verification bit is received, whether the first verification bit is a fail bit is determined. If the first verification bit is not a fail bit, the first verification bit (a pass bit) is discarded. If the first verification bit is a fail bit, a binary value representing fail bit, e.g., binary 1, is written into and stored in the first counter latch.

In this disclosure, a latch storing a binary value not representing fail bit is also referred to as the latch not storing a fail bit; and a latch storing a binary value representing fail bit is also referred to as the latch storing a fail bit. Correspondingly, writing/storing a binary value representing fail bit into a latch is also referred to as writing/storing a fail bit into the latch; and transferring a binary value representing fail bit to a latch is also referred to as transferring a fail bit to the latch.

After the second verification bit is received, whether the second verification bit is a fail bit and the first counter latch already stores a fail bit is determined. If the second verification bit is a fail bit and the first counter latch already stores a fail bit, a fail bit is written into and stored in the second counter latch. If the condition of the second verification bit being a fail bit and the first counter latch already storing a fail bit is not satisfied, e.g., if the first counter latch does not store a fail bit, then it is further determined whether the second verification bit is a fail bit. In this further determination, if it is determined that the second verification bit is a fail bit, then a fail bit is written into and stored in the first counter latch. On the other hand, if the second verification bit is not a fail bit, the second verification bit (a pass bit) is discarded.

After the third verification bit is received, whether the third verification bit is a fail bit, and both the first counter latch and the second counter latch already store a fail bit is determined. If the third verification bit is a fail bit and both the first counter latch and the second counter latch already store a fail bit, a fail bit is written into and stored in the third counter latch.

If the condition of the third verification bit being a fail bit and both the first counter latch and the second counter latch already storing a fail bit is not satisfied, e.g., if the second counter latch does not store a fail bit, then it is further determined whether the third verification bit is a fail bit and the first counter latch already stores a fail bit. If this condition is satisfied (i.e., the third verification bit is a fail bit and the first counter latch already stores a fail bit), then a fail bit is written into and stored in the second counter latch. However, if the condition of the third verification bit being a fail bit and the first counter latch storing a fail bit is not satisfied, then it is further determined whether the third verification bit is a fail bit. If it is determined that the third verification bit is a fail bit, then a fail bit is written into and stored in the first counter latch. On the other hand, if the third verification bit is not a fail bit, the third verification bit (a pass bit) is discarded.

Figure 13B:
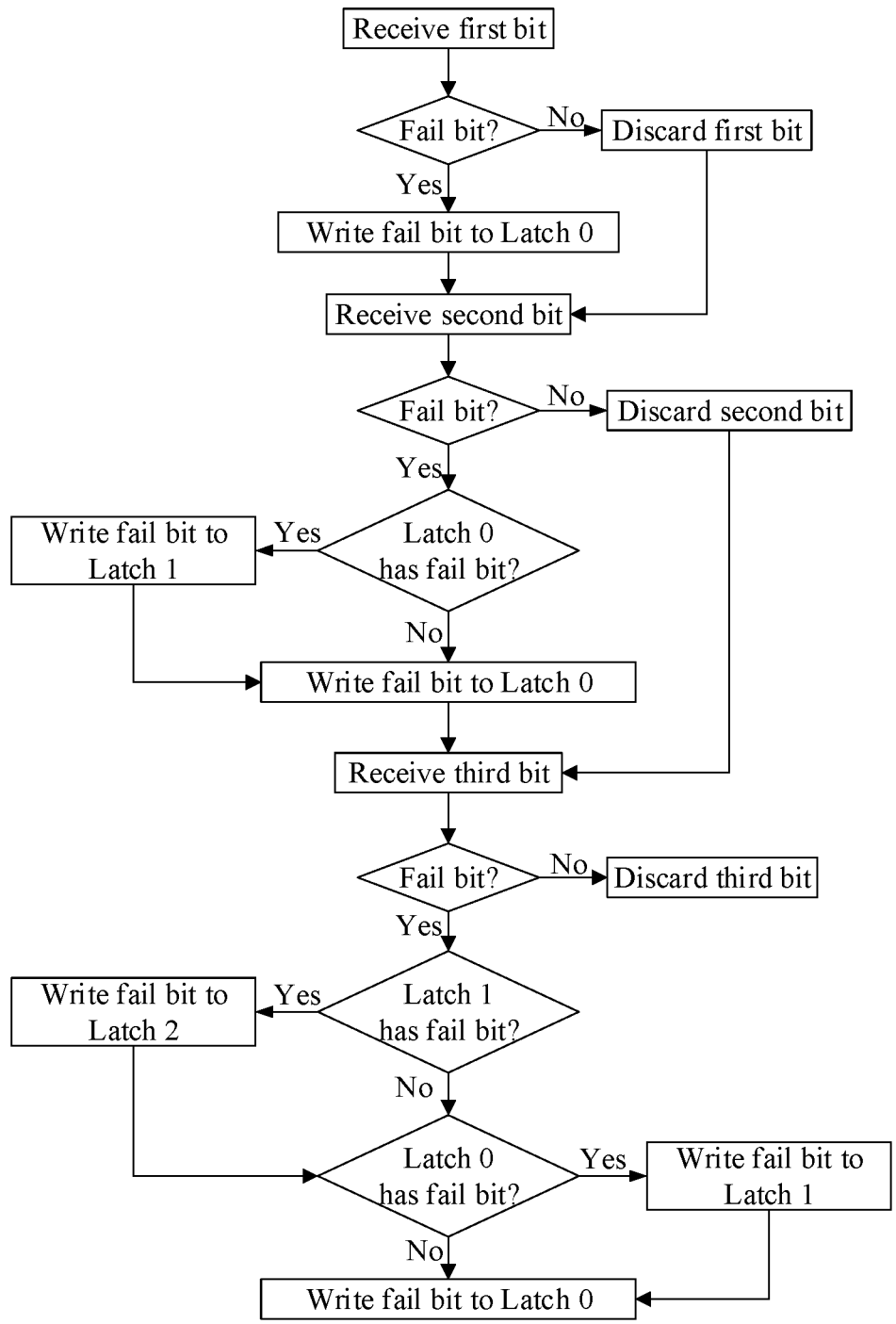

FIG. 13B is a flow charts showing another example of checking verification bits and counting fail bits that can be applied to the counter 900. In the example shown in FIG. 13B, a bit group including three verification bits is received and checked, and the fail bits among the received verification bits are counted and stored in the counter 900. The output from the counter 900 is the number of fail bits in unary format. Similar to FIG. 13A, FIG. 13B shows three verification bits being received as an example, but the process can be scaled down to one or two verification bits, or expanded to four or more verification bits.

The methods according to some aspects of the present disclosure do not need to check all the counter stages (the storage status of each latch) in the counter for every received verification bit, and hence can reduce the time needed for counting the fail bits. Especially for a larger scale counter (counter having more counter latches) used for counting bit groups containing a large number of verification bits, the reduction in time is even more significant.

In some of the embodiments described above, such as the embodiments described in connection with FIGS. 2-4, the VFC circuit includes a transcoder circuit including one or more transcoders each configured to transcode the failbit count result (number of fail bits) in unary format output by a corresponding counter into the failbit count result in binary format. According to some other aspects of the present disclosure, a counter can be controlled to directly transcode the unary format count result to a binary format count result, and hence the transcoder circuit can be omitted from the VFC circuit. This is described in more detail below.

Figure 14:
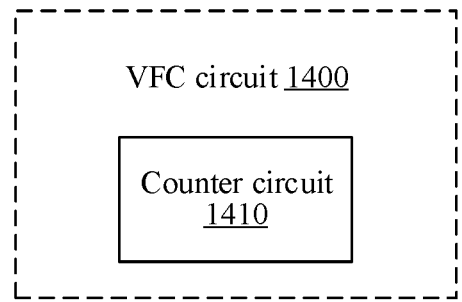
FIG. 14 is a block diagram of another example verify failbit count (VFC) circuit according to some aspects of the present disclosure.
Figure 15:
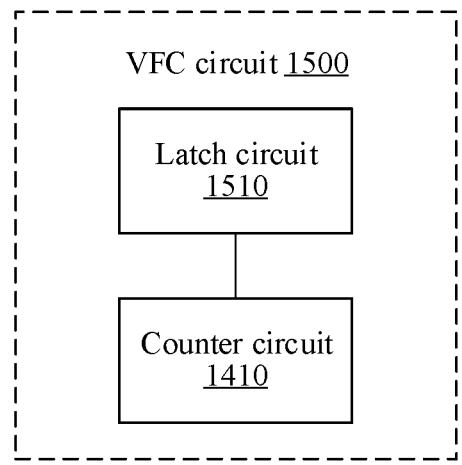
FIG. 15 is a block diagram of another example VFC circuit according to some aspects of the present disclosure.
Figure 16:
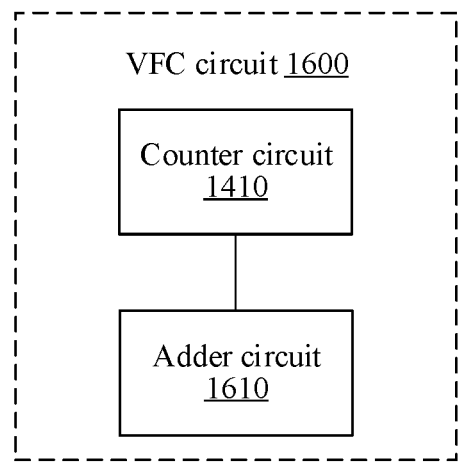
FIG. 16 is a block diagram of another example VFC circuit according to some aspects of the present disclosure.

FIGS. 14-16 are block diagrams of example VFC circuits 1400, 1500, and 1600, respectively, according to some aspects of the present disclosure. As shown in FIG. 14, the VFC circuit 1400 includes a counter circuit 1410. As shown in FIG. 15, the VFC circuit 1500 includes the counter circuit 1410 and a latch circuit 1510 coupled to each other. As shown in FIG. 16, the VFC circuit 1600 includes the counter circuit 1410 and an adder circuit 1610 coupled to each other. That is, the VFC circuits 1400, 1500, and 1600 are similar to the VFC circuits 200, 300, and 400 described above, respectively. The main difference is that the VFC circuits 1400, 1500, and 1600 do not have a transcoder circuit.

Each counter in the counter circuit 1410 can be configured to output a failbit count result in binary format. In some implementations, each counter in the counter circuit 1410 can have, e.g., a structure similar to that shown in FIG. 9A. As described above in connection with FIG. 9A. for a counter according to some aspects of the present application, the first control signal, the second control signals for various counter stages in the counter, and the reset and set signals for various counter stages in the counter can be generated and controlled by a controller to facilitate the counter to count, in the unary format, the number of fail bits provided by the buffer circuit. Further, the first control signal, the second control signals for various counter stages, and the reset and set signals for various counter stages can be generated and controlled by the controller to further transcode the count result in unary format into a count result in binary format. That is, counting of fail bits in unary format and transcoding the unary format count result into a binary format count result can be both performed by the counter. The controller can be, for example, the control logic 140 described above or the memory controllers 2006, 2104, and 2204, or the processor 2313 described below.

In the example VFC circuit 1600 shown in FIG. 16, the adder circuit 1610 is coupled to the counter circuit 1410 directly. Therefore, the adder circuit 1610 can sum up the outputs (in binary format) from the plurality of counters of the counter circuit 1410. For example, the adder circuit 1610 can include one adder configured to add outputs from two counters. As another example, the adder circuit 1610 can include a plurality of adders configured in a multi-level configuration, i.e., arranged in a plurality of levels. Each adder in the first level of the multi-level configuration can be configured to add outputs from two counters. Further, each adder in a subsequent level of the multi-level configuration can be configured to add outputs from two adders in a previous level, or to add the output from one adder in a previous level and the output from one counter. For example, the counter circuit 1410 includes four counters. In this scenario, the adder circuit 1610 can include three adders, with two adders in the first level each configured to add outputs from two counters and one adder in the second level configured to add outputs from the two adders in the first level. As another example, the counter circuit 1410 includes three counters. In this scenario, the adder circuit 1610 can include two adders, with one adder in the first level configured to add outputs from two counters and one adder in the second level configured to add the output from the adder in the first level and the output from the third counter.

For other detailed description of the VFC circuits 1400, 1500, and 1600 not specifically set forth here, reference can be made to the descriptions above of the VFC circuits 200, 300, and 400, respectively, except for the parts related to the transcoder circuit 220.

In some implementations, each VFC sub-circuit 510 in the VFC circuit 500 shown in FIG. 5 can have a structure same as or similar to the VFC circuit 1400 shown in FIG. 14, the VFC circuit 1500 shown in FIG. 15, or the VFC circuit 1600 shown in FIG. 16.

Figure 17:
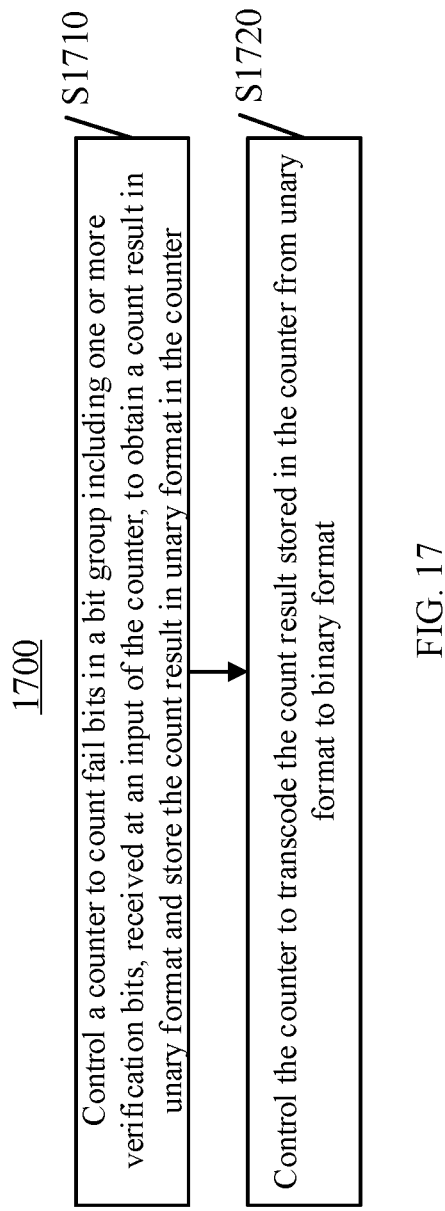
FIG. 17 is a flowchart showing an example method for counting fail bits and converting count result from unary format to binary format according to some aspects of the present disclosure.

FIG. 17 is a flowchart showing an example failbit counting method 1700 according to some aspects of the present disclosure. The method 1700 can be applied to a memory device according to some aspects of the present disclosure, such as any of the example memory devices according to some aspects of the present disclosure (e.g., the memory device 100 shown in FIG. 1A or 1B). In some implementations, the method 1700 can be implemented by, e.g., a VFC circuit according to some aspects of the present disclosure, such as any of the example VFC circuits described above, under the control of a processing device, such as any of the control logic 140 described above or the example memory controllers 2006, 2104, and 2204, or the processor 2313 described below. As shown in FIG. 17, the method 1700 includes the following processes.

At S1710, a counter of the VFC circuit is controlled to count fail bits in a bit group including one or more verification bits, received at an input of the counter, to obtain a count result in unary format. Each of the one or more verification bits is a fail bit or a pass bit. The count result in unary format is stored in the counter. Details about how the counter counts number of fail bits and stores the count result in unary format are described above, for example, in connection with FIGS. 9A-13B.

At S1720, the counter is controlled to transcode the count result stored in the counter from unary format to binary format. In some implementations, the counter stages of the counter are controlled by various control signals such that the latches thereof toggle between storing logic 1 and storing logic 0, or to remain unchanged, to convert the unary format count result to binary format count result.

In some implementations, the various control signals can be applied to various transistors in the counter stages of the counter to control on and off of the transistors, so as to realize changing or maintaining of the voltage levels at various nodes in the counter, as well as changing or maintaining of the storage states of the latches in the various counter stages of the counter. For example, the voltage level of certain node(s) in the counter can depend on the storage states of one or more of the latches, and that voltage level can be used to control on/off of certain transistor(s), which in turn can control whether a set/reset signal applied to a latch can be effective in affecting the storage state of the latch.

For example, as shown in FIG. 9A, the gate of each third transistor (916, 926, 936, 946) is coupled to a corresponding latch (912, 922, 932, 942) and hence whether the third transistor is on or off can depend on the storage state of the corresponding latch. Then, once any RD control signal (RD_S, RD<0>, RD<1>, RD<2>) is received, whether the corresponding transistor string (915, 925, 935, 945) is conducting can depend on whether the corresponding third transistor is on or off (i.e., the storage state of the corresponding latch), which in turn can decide whether node S0 will be pulled down to the low voltage level. Whether node S0 is at high voltage level or low voltage level can decide whether the ground transistor 952 is on or off, which in turn can decide whether node com_s is at the low voltage level or is floating. If node com_s is at the low voltage level, then a set/reset signal applied to a counter stage can effect its intended purpose on the storage state of the corresponding latch; while if node com_s is floating, the set/reset signal will not have effect on the storage state of the corresponding latch.

Therefore, by supplying proper pulsed control signals to various nodes in the circuit of the counter, conversion of the stored count result from unary format to binary format can be realized.

Various control methods (and corresponding control signal timing diagrams) can be applied to realize the control of the counter to transcode the stored count result from unary format to binary format. Examples are described below in connection with FIGS. 18A-19B. The example methods described below can be applied to a memory device according to some aspects of the present disclosure, such as any of the example memory devices according to some aspects of the present disclosure (e.g., the memory device 100 shown in FIG. 1A or 1B). In some implementations, the example methods can be implemented by, e.g., a VFC circuit according to some aspects of the present disclosure, such as any of the example VFC circuits described above, under the control of a processing device, such as any of the control logic 140 described above or the example memory controllers 2006, 2104, and 2204, or the processor 2313 described below.

Figure 18A:
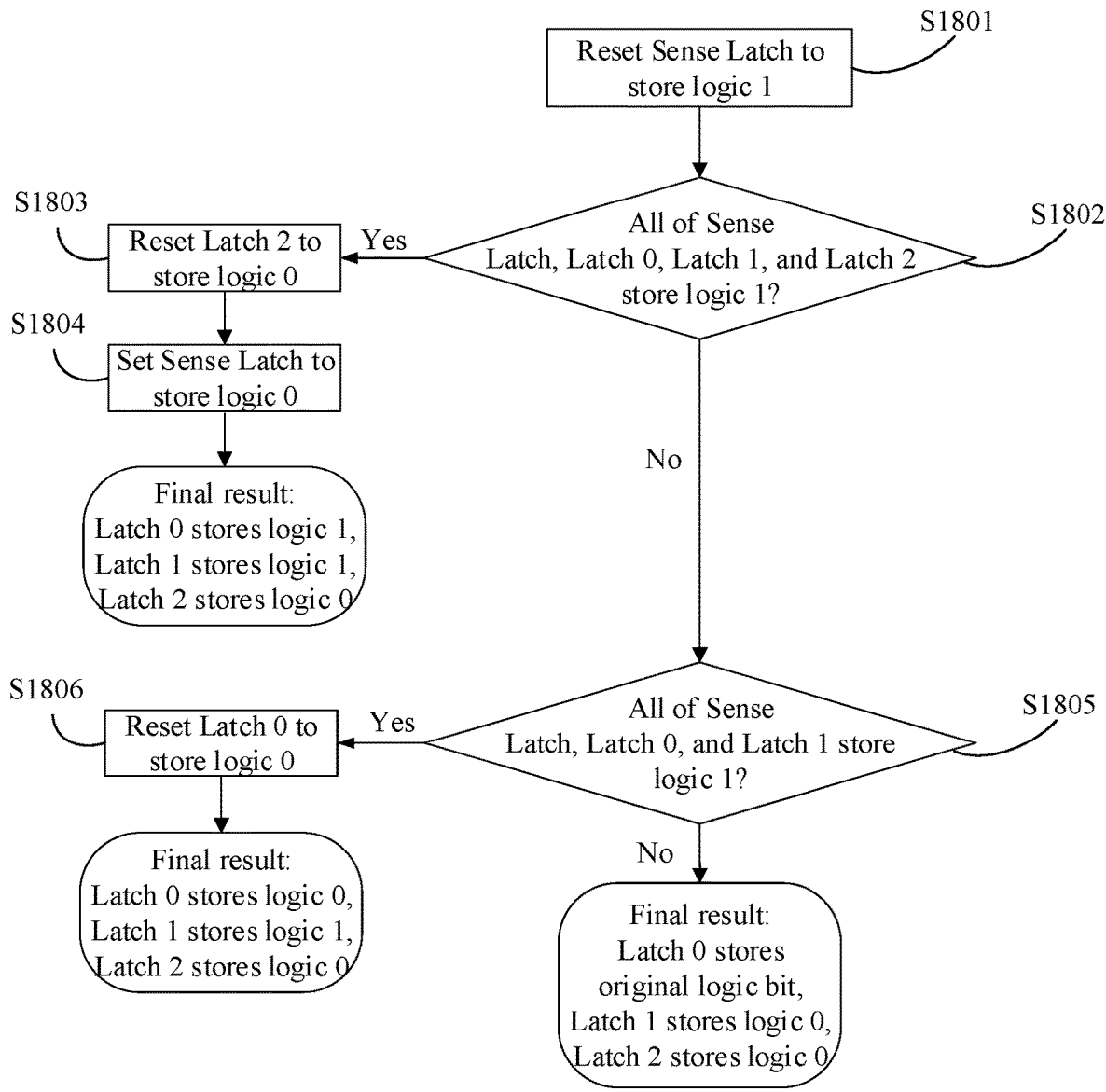
FIG. 18A is a flow chart showing an example of converting unary format count result to binary format count result applied to the counter shown in FIG. 9A.

FIG. 18A is a flow chart showing an example of converting the unary format count result to binary format count result that can be applied to the counter 900 shown in FIG. 9A. According to the embodiments described above, in the counter 900, among Latch 0 (second counter latch 922), Latch 1 (third counter latch 932), and Latch 2 (fourth counter latch 942), a counter latch closer to Sense Latch (first counter latch 912) is used to store an earlier-received fail bit and a counter latch farther away from Sense Latch is used to store a later-received fail bit. Therefore, the sorting order for representing a unary format number is Latch 2-Latch 1-Latch 0. For example, a status in which Latch 0 stores logic 1, Latch 1 stores logic 1, and Latch 2 stores logic 0 represents a unary format number of 011, while a status in which Latch 0 stores logic 1, Latch 1 stores logic 0, and Latch 2 stores logic 0 represents a unary format number of 001. Similarly, after the conversation operation, the sorting order for representing a binary format number is also Latch 2-Latch 1-Latch 0. For example, a status in which Latch 0 stores logic 1, Latch 1 stores logic 1, and Latch 2 stores logic 0 represents a binary format number of 011, while a status in which Latch 0 stores logic 0, Latch 1 stores logic 1, and Latch 2 stores logic 0 represents a binary format number of 010.

As shown in FIG. 18A, at S1801, Sense Latch is reset to store logic 1. In some implementations, Sense Latch stores its logic bit at node Fail_<0>. Thus, resetting Sense Latch to store logic 1 causes node Fail_<0> to be at logic 1 and node Fail_n<0> to be at logic 0. At S1802, it is determined whether all of Sense Latch, Latch 0, Latch 1, and Latch 2 all store logic 1. Because at the previous process Sense Latch is already reset to store logic 1, at the current process Sense Latch remains in the status of storing logic 1. Thus, this process essentially determines whether Latch 0, Latch 1, and Latch 2 all store logic 1. In some implementations, Latch 0, Latch 1, and Latch 2 store their logic bits at nodes Fail<0>, Fail<1>, and Fail<2>, respectively. Thus, determining whether Latch 0, Latch 1, and Latch 2 all store logic 1 is equivalent to determining whether nodes Fail<0>, Fail<1>, and Fail<2> are all at logic 1.

If Sense Latch, Latch 0, Latch 1, and Latch 2 all store logic 1 (S1802:Yes), then at S1803, Latch 2 is reset to store logic 0, i.e., node Fail<2> is changed from logic 1 to logic 0. Further, at S1804, Sense Latch is set to store logic 0, i.e., node Fail_<0> is changed from logic 1 to logic 0 and node Fail_n<0> is changed from logic 0 to logic 1. Setting Sense Latch to logic 0 can cause further operations on other counter latches to be ineffective (as will be described in more detail later), and hence the status of the counter can remain unchanged till the end of the conversion operation. At the end of the conversion operation, Latch 0 and Latch 1 store logic 1, and Latch 2 stores logic 0, representing a binary format number of 011 (corresponding to a unary format number of 111).

If at S1802, it is determined that not all of Sense Latch, Latch 0, Latch 1, and Latch 2 store logic 1 (S1802:No), then at S1805, it is determined whether all of Sense Latch, Latch 0, and Latch 1 store logic 1. Since the counter initially stores count result in unary format, not all of Sense Latch, Latch 0, Latch 1, and Latch 2 storing logic 1 can mean that at least Latch 2 does not store logic 1. Then it is determined whether other counter latches all store logic 1.

If all of Sense Latch, Latch 0, and Latch 1 store logic 1 (S1805:Yes), then at S1806, Latch 0 is reset to store logic 0. At the end of the conversion operation, Latch 0 and Latch 2 store logic 0, and Latch 1 stores logic 1, representing a binary format number of 010 (corresponding to a unary format number of 011).

If not all of Sense Latch, Latch 0, and Latch 1 store logic 1 (S1805:No), then it means that at least Latch 1 stores logic 0. In this scenario, the final result of the conversion operation will be that Latch 1 and Latch 2 both store logic 0, and the storage status of Latch 0 remains unchanged, i.e., Latch 0 stores original logic bit. Therefore, if Latch 0 originally stores logic 1, then at the end of the conversion operation, Latch 1 and Latch 2 store logic 0, and Latch 0 stores logic 1, representing a binary format number of 001 (corresponding to a unary format number of 001). On the other hand, if Latch 0 originally stores logic 0, then at the end of the conversion operation, all of Latch 0, Latch 1, and Latch 2 store logic 0, representing a binary format number of 000 (corresponding to a unary format number of 000).

Figure 18B:
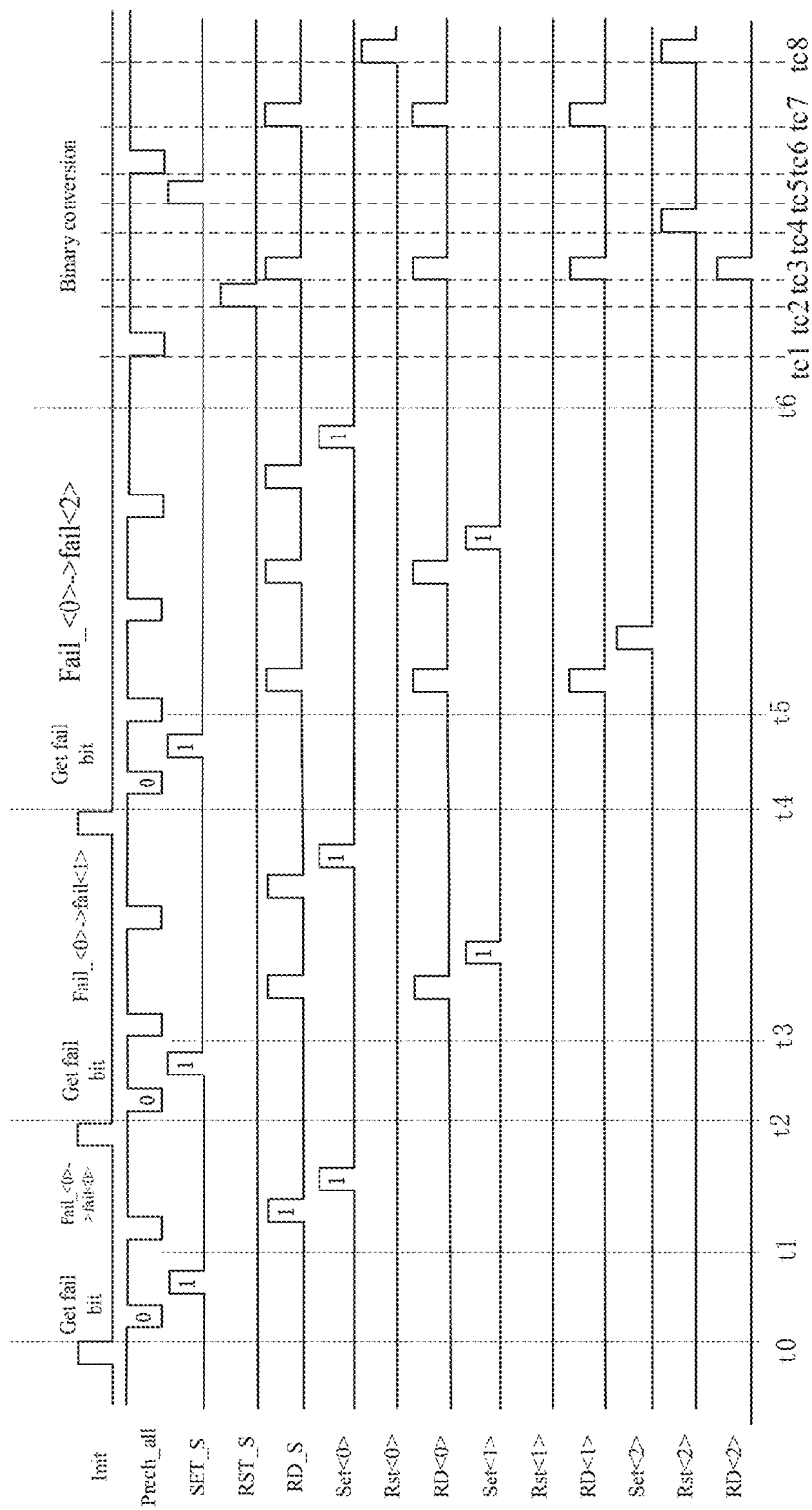
FIG. 18B is a schematic example timing diagram for the counter shown in FIG. 9A.

FIG. 18B is a schematic example timing diagram for the example counter 900 shown in FIG. 9A, corresponding to the method shown in FIG. 18A and showing example changes of various signals for controlling the counter 900 to count fail bits and convert unary format count result to binary format count result. The fail bit counting part in FIG. 18B (before t6) is similar to that in FIG. 9B, and detailed description thereof is omitted. An example of the control and operation of the counter 900 for the binary conversion operation (after t6 in FIG. 18B) is described below with reference to FIGS. 9 and 18B.

In the example shown in FIG. 9A, unary format count result is stored in Latch 0, Latch 1, and Latch 2. Correspondingly, in FIG. 18B, timing sequences of control signals Prech_all, SET_S, RST_S, RD_S, Set<0>, Rst<0>, RD<0>, Set<1>, Rst<1>, RD<1>, Set<2>, Rst<2>, and RD<2> are shown, which achieve transcoding of the count result in unary format to the count result in binary format.

As shown in FIG. 18B, at tc1, a pulsed control signal Prech_all is received. As shown in FIG. 9A, the pulsed control signal Prech_all turns on the power-supply transistor 954, hence node S0 is at high level. At tc2, a pulsed control signal RST_S is received to reset Sense Latch, as a result of which, node Fail_<0> becomes logic 1 and node Fail_n<0> becomes logic 0, i.e., Sense Latch stores logic 1. This process corresponds to S1801 in FIG. 18A.

At tc3, pulsed control signals RD_S, RD<0>, RD<1>, and RD<2> are received, which turn on the fourth transistors 917, 927, 937, and 947, respectively, in the first counter stage 910, the second counter stage 920, the third counter stage 930, and the fourth counter stage 940, respectively. At this time, if all of Sense Latch, Latch 0, Latch 1, and Latch 2 store logic 1, i.e., if all of nodes Fail_<0>, Fail<0>, Fail<1>, and Fail<2> are at logic 1, all of the third transistors 916, 926, 936, and 946 are turned off. As a result, S0 remains at high level. On the other hand, if not all of Sense Latch, Latch 0, Latch 1, and Latch 2 store logic 1, i.e., if any of Sense Latch, Latch 0, Latch 1, and Latch 2 stores logic 0, then at least one of the third transistors 916, 926, 936, and 946 is turned on. As a result, S0 is pulled down to low level. Because the counter 900 initially stores the count result in unary format, not all of Sense Latch, Latch 0, Latch 1, and Latch 2 storing logic 1 would mean that at least Latch 2 stores logic 0. The pulsed control signals at tc3 essentially function to perform the operation at S1802 in FIG. 18A.

At tc4, a pulsed control signal Rst<2> is received. At this time, if S0 is at high level (i.e., all of Sense Latch, Latch 0, Latch 1, and Latch 2 initially store logic 1), the common ground transistor 952 is on, and node com_s is at low level. Thus, the pulsed control signal Rst<2> can reset Latch 2 to store logic 0, i.e., node Fail<2> becomes logic 0. In this scenario, the pulsed control signal Rst<2> at tc4 essentially functions to perform the operation at S1803 in FIG. 18A.

On the other hand, if, at tc4, S0 is at low level (i.e., not all of Sense Latch, Latch 0, Latch 1, and Latch 2 initially store logic 1), then the common ground transistor 952 is off, and node com_s is floating. Thus, the pulsed control signal Rst<2> will not have effect on Latch 2, and the logic bit stored in Latch 2 remains unchanged, which is logic 0.

At tc5, a pulsed control signal SET_S is received. At this time, if S0 is at high level (i.e., all of Sense Latch, Latch 0, Latch 1, and Latch 2 initially store logic 1), the common ground transistor 952 is on, and node com_s is at low level. Thus, the pulsed control signal SET_S can set Sense Latch to store logic 0, i.e., node Fail_<0> becomes logic 0 and node Fail_n<0> becomes logic 1. In this scenario, the pulsed control signal SET_S at tc5 essentially functions to perform the operation at S1804 in FIG. 18A. Setting node Fail_n<0> to logic 1 turns on the third transistor 916 in the first counter stage 910. Thus, in subsequent operations, once a pulsed signal RD_S is received to turn on the fourth transistor 917 in the first counter stage 910, S0 will always be pulled down to low level, irrespective of the storage status in the other latches. This essentially makes all subsequent pulsed set or reset signals to other counter stages ineffective in changing the storage status of corresponding latches. The storage status of Latch 0 and Latch 1 (both store logic 1) will carry through the rest of the binary conversion operation. As a result, after the binary conversation operation is completed, the logic bits stored in Latch 0, Latch 1, and Latch 2 will be logic 1, logic 1, and logic 0, respectively. That is, a unary format number 111 is converted to a binary format number 011.

On the other hand, if, at tc5, S0 is at low level (i.e., not all of Sense Latch, Latch 0, Latch 1, and Latch 2 initially store logic 1), then the common ground transistor 952 is off, and node com_s is floating. Thus, the pulsed control signal RST_S will not have effect on Sense Latch, and the logic bit stored in Sense Latch remains unchanged, which is logic 1 (i.e., node Fail_n<0> remains logic 0).

As noted above, if all of Sense Latch, Latch 0, Latch 1, and Latch 2 initially store logic 1, as a result of the pulsed control signals at tc5, Sense Latch becomes storing logic 0 and all subsequent pulsed set or reset signals to other counter stages are ineffective in changing the storage status of corresponding latches. Therefore, in the discussion below regarding subsequent pulsed control signals, only scenarios in which Sense Latch stores logic 1 is discussed.

At tc6, a pulsed control signal Prech_all is received, as a result of which node S0 is at high level.

At tc7, pulsed control signals RD_S, RD<0>, and RD<1> are received, which turn on the fourth transistors 917, 927, and 937, respectively, in the first counter stage 910, the second counter stage 920, and the third counter stage 930, respectively. At this time, if all of Sense Latch, Latch 0, and Latch 1 store logic 1, i.e., if all of nodes Fail_<0>, Fail<0>, and Fail<1> are at logic 1, all of the third transistors 916, 926, and 936 are off. As a result, S0 remains at high level. On the other hand, if not all of Sense Latch, Latch 0, and Latch 1 store logic 1, i.e., if any of Sense Latch, Latch 0, and Latch 1 stores logic 0, then at least one of the third transistors 916, 926, and 936 is turned on. As a result, S0 is pulled down to low level. The pulsed control signals at tc7 essentially function to perform the operation at S1805 in FIG. 18A.

At tc8, pulsed control signals Rst<0> and Rst<2> are received. Since Latch 2 either initially stores logic 0 or has been changed to store logic 0 at tc4, Rst<2> received at tc8 will not change the storage status of Latch 2, and the final logic bit stored in Latch 2 will be logic 0.

For Latch 0, if, at tc8, S0 is at high level (i.e., all of Sense Latch, Latch 0, and Latch 1 store logic 1), the common ground transistor 952 is on, and node com_s is at low level. Thus, the pulsed control signal Rst<0> can reset Latch 0 to store logic 0, i.e., node Fail<0> becomes logic 0. In this scenario, the pulsed control signal Rst<0> at tc8 essentially functions to perform the operation at S1806 in FIG. 18A. In this scenario, the storage status of Latch 1, which is logic 1, remains unchanged throughout the binary conversion operation. As a result, after the binary conversation operation is completed, the logic bits stored in Latch 0, Latch 1, and Latch 2 will be logic 0, logic 1, and logic 0, respectively. That is, a unary format number 011 is converted to a binary format number 010.

On the other hand, if, at tc8, S0 is at low level (i.e., not all of Sense Latch, Latch 0, and Latch 1 store logic 1), then the common ground transistor 952 is off, and node com_s is floating. Thus, the pulsed control signal Rst<0> will not have effect on Latch 0, and the logic bit stored in Latch 0 remains unchanged. Because the counter 900 initially stores the count result in unary form, not all of Sense Latch, Latch 0, and Latch 1 storing logic 1 means at least Latch 1 stores logic 0 and hence Latch 1 still stores logic 0 at the end of the conversion operation. Therefore, if Latch 0 initially stores logic 1, after the binary conversation operation is completed, the logic bits stored in Latch 0, Latch 1, and Latch 2 will be logic 1, logic 0, and logic 0. That is, a unary format number 001 is converted to a binary format number 001. On the other hand, if Latch 0 initially stores logic 0, after the binary conversation operation is completed, the logic bits stored in Latch 0, Latch 1, and Latch 2 will be logic 0, logic 0, and logic 0. That is, a unary format number 000 is converted to a binary format number 000.

In some implementations, at tc8, only pulsed control signal Rst<0> is received while no pulsed control signal Rst<2> is received.

Tables 1~4 below summarize the change of logic bits at notes Fail_<0>, Fail_n<0>, Fail<0>, Fail<1>, and Fail<2>, as well as voltage levels of nodes S0 and com_s, during the binary conversion operation for initially stored unary numbers 111, 011, 001, and 000, respectively. In these tables, H represents high level, L represents low level, F represents floating, and dash ("-") represents unknown, either way, or does not care.

TABLE 1

|  | Initial | tc1 | tc2 | tc3 | tc4 | tc5 | tc6 | tc7 | tc8 |
| --- | --- | --- | --- | --- | --- | --- | --- | --- | --- |
| S0 | — | H | H | H | H | H | H | L | L |
| com_s | — | L | L | L | L | L | L | F | F |
| Fail_n<0> | — | — | 0 | 0 | 0 | 1 | 1 | 1 | 1 |
| Fail_<0> | — | — | 1 | 1 | 1 | 0 | 0 | 0 | 0 |
| Fail<0> | 1 | 1 | 1 | 1 | 1 | 1 | 1 | 1 | 1 |
| Fail<1> | 1 | 1 | 1 | 1 | 1 | 1 | 1 | 1 | 1 |
| Fail<2> | 1 | 1 | 1 | 1 | 0 | 0 | 0 | 0 | 0 |

TABLE 2

|  | Initial | tc1 | tc2 | tc3 | tc4 | tc5 | tc6 | tc7 | tc8 |
| --- | --- | --- | --- | --- | --- | --- | --- | --- | --- |
| S0 | — | H | H | L | L | L | H | H | L |
| com_s | — | L | L | F | F | F | L | L | F |
| Fail_n<0> | — | — | 0 | 0 | 0 | 0 | 0 | 0 | 0 |
| Fail_<0> | — | — | 1 | 1 | 1 | 1 | 1 | 1 | 1 |
| Fail<0> | 1 | 1 | 1 | 1 | 1 | 1 | 1 | 1 | 0 |
| Fail<1> | 1 | 1 | 1 | 1 | 1 | 1 | 1 | 1 | 1 |
| Fail<2> | 0 | 0 | 0 | 0 | 0 | 0 | 0 | 0 | 0 |

TABLE 3

|  | Initial | tc1 | tc2 | tc3 | tc4 | tc5 | tc6 | tc7 | tc8 |
| --- | --- | --- | --- | --- | --- | --- | --- | --- | --- |
| S0 | — | H | H | L | L | L | H | L | L |
| com_s | — | L | L | F | F | F | L | F | F |
| Fail_n<0> | — | — | 0 | 0 | 0 | 0 | 0 | 0 | 0 |
| Fail_<0> | — | — | 1 | 1 | 1 | 1 | 1 | 1 | 1 |
| Fail<0> | 1 | 1 | 1 | 1 | 1 | 1 | 1 | 1 | 1 |
| Fail<1> | 0 | 0 | 0 | 0 | 0 | 0 | 0 | 0 | 0 |
| Fail<2> | 0 | 0 | 0 | 0 | 0 | 0 | 0 | 0 | 0 |

TABLE 4

|  | Initial | tc1 | tc2 | tc3 | tc4 | tc5 | tc6 | tc7 | tc8 |
| --- | --- | --- | --- | --- | --- | --- | --- | --- | --- |
| S0 | — | H | H | L | L | L | H | L | L |
| com_s | — | L | L | F | F | F | L | F | F |
| Fail_n<0> | — | — | 0 | 0 | 0 | 0 | 0 | 0 | 0 |
| Fail_<0> | — | — | 1 | 1 | 1 | 1 | 1 | 1 | 1 |
| Fail<0> | 0 | 0 | 0 | 0 | 0 | 0 | 0 | 0 | 0 |
| Fail<1> | 0 | 0 | 0 | 0 | 0 | 0 | 0 | 0 | 0 |
| Fail<2> | 0 | 0 | 0 | 0 | 0 | 0 | 0 | 0 | 0 |

Figure 19A:
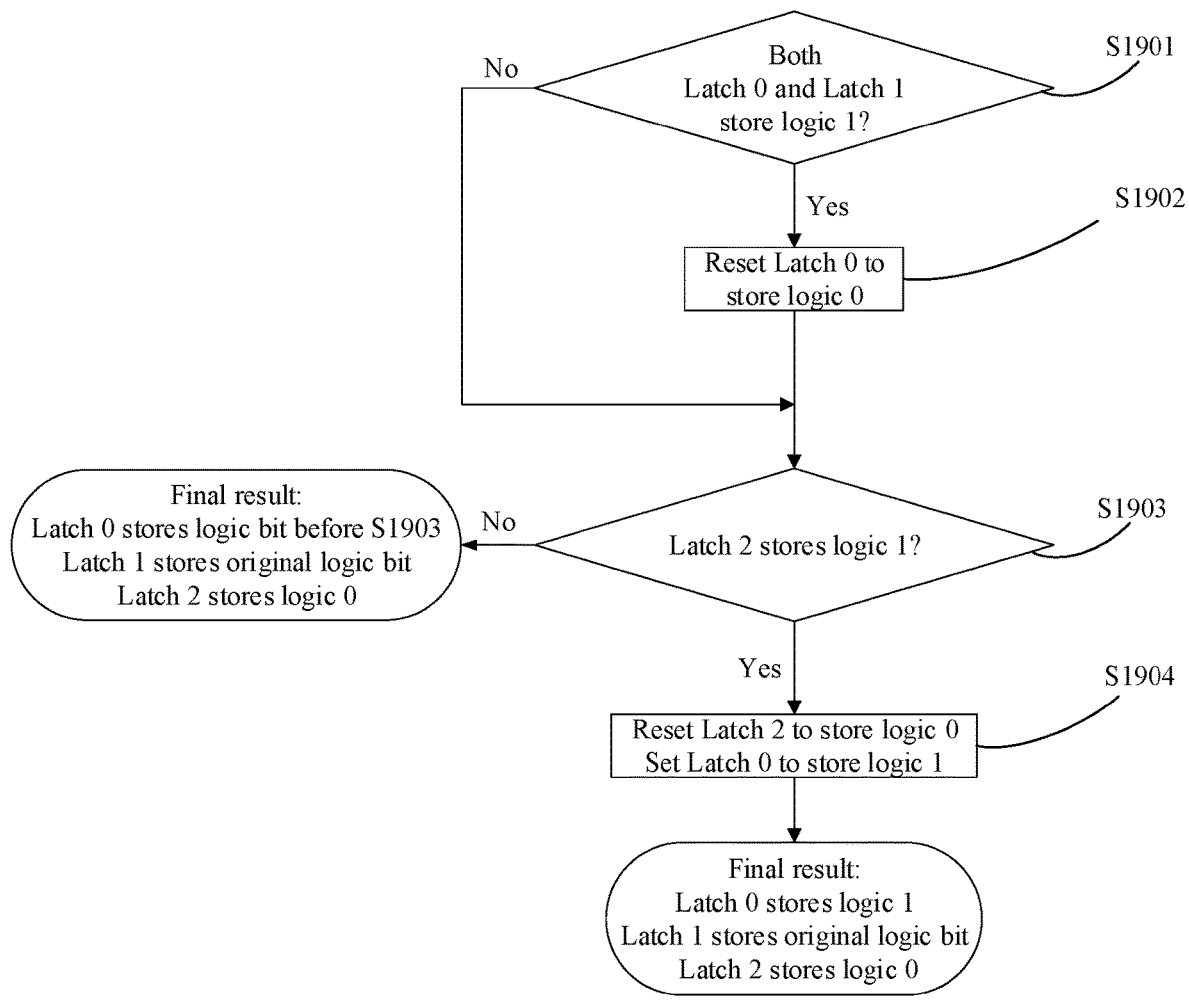
FIG. 19A is a flow chart showing another example of converting unary format count result to binary format count result applied to the counter shown in FIG. 9A.

FIG. 19A is a flow chart showing another example of converting the unary format count result to binary format count result that can be applied to the counter 900 shown in FIG. 9A. As shown in FIG. 19A, at S1901, it is determined whether both of Latch 0 and Latch 1 store logic 1. As described above, in some implementations, Latch 0 and Latch 1 store their logic bits at nodes Fail<0> and Fail<1>, respectively. Thus, determining whether Latch 0 and Latch 1 both store logic 1 is equivalent to determining whether nodes Fail<0> and Fail<1> are both at logic 1.

If Latch 0 and Latch 1 both store logic 1 (S1901: Yes), then at S1902, Latch 0 is reset to store logic 0, i.e., node Fail<0> is changed from logic 1 to logic 0. On the other hand, if at S1901, it is determined that not both of Latch 0 and Latch 1 store logic 1 (S1901:No), then at S1903, it is determined whether Latch 2 stores logic 1.

If, at S1903, it is determined that Latch 2 does not store logic 1 (S1903:No), i.e., Latch 2 stores logic 0, then it means that in this scenario, the final result of the conversion operation will be that Latch 0 stores the logic bit before S1903, Latch 1 stores original logic bit, and Latch 2 stores logic 0. That is, if the determination result at S1901 is no, then the logic bits originally stored in Latch 0 and Latch 1 will carry to the end of the conversion operation; and if the determination result at S1901 is yes, then the logic bit originally stored in Latch 1 will carry to the end of the conversion operation while Latch 0 will store logic 0 at the end of the conversion operation.

On the other hand, if, at S1903, it is determined that Latch 2 stores logic 1 (S1903: Yes), then at S1904, Latch 2 is reset to store logic 0 and Latch 0 is set to store logic 1. At the end of the conversion operation, Latch 0 stores logic 1, Latch 1 stores original logic bit, and Latch 2 stores logic 0.

Figure 19B:
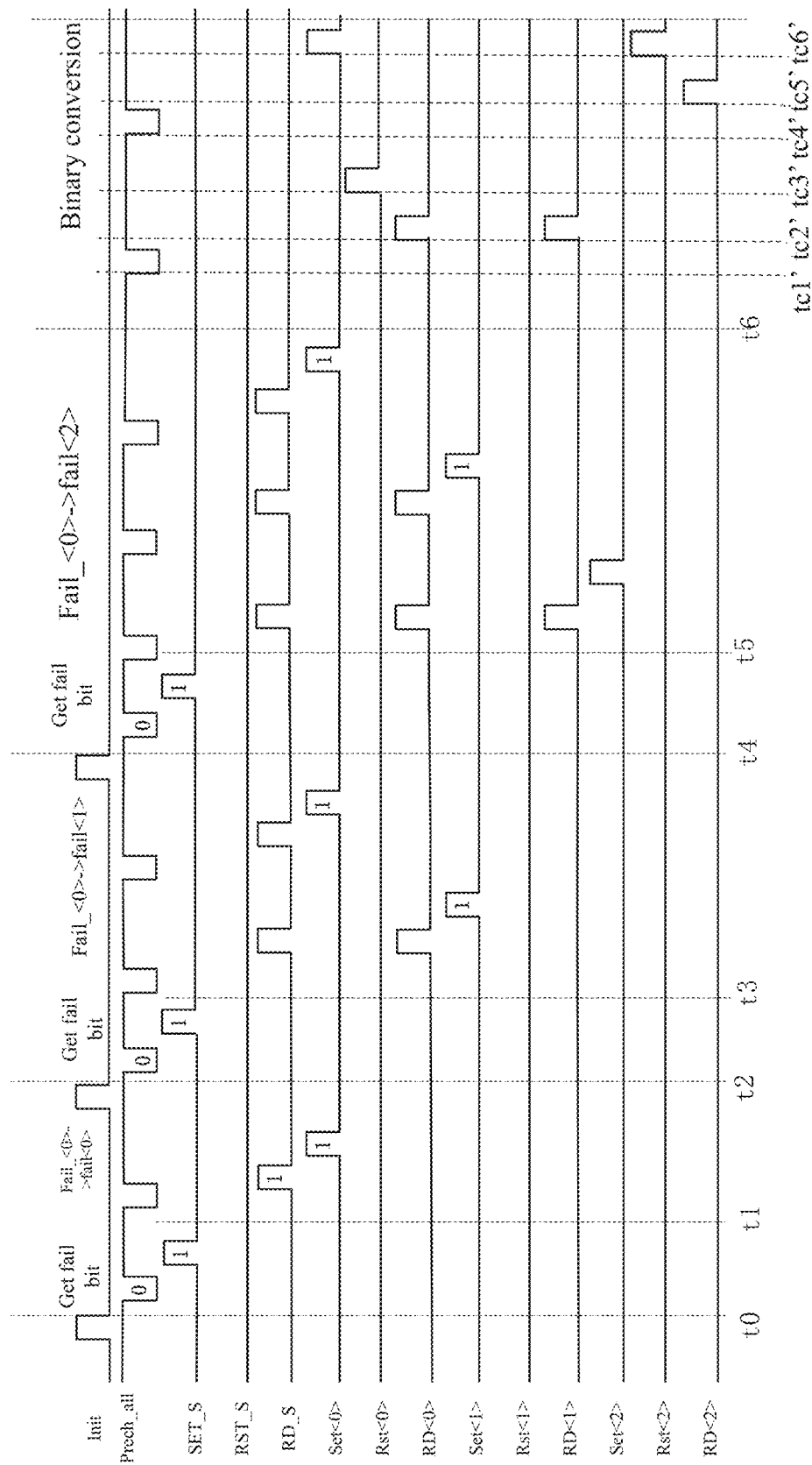
FIG. 19B is another schematic example timing diagram for the counter shown in FIG. 9A.

FIG. 19B is another schematic example timing diagram for the example counter 900 shown in FIG. 9A, corresponding to the method shown in FIG. 19A and showing example changes of various signals for controlling the counter 900 to count fail bits and convert unary format count result to binary format count result. The fail bit counting part in FIG. 19B (before t6) is similar to that in FIG. 9B, and detailed description thereof is omitted. An example of the control and operation of the counter 900 for the binary conversion operation (after t6 in FIG. 19B) is described below with reference to FIGS. 9 and 19B.

In the example shown in FIG. 9A, unary format count result is stored in Latch 0, Latch 1, and Latch 2. Correspondingly, in FIG. 19B, timing sequences of control signals Prech_all, SET_S, RST_S, RD_S, Set<0>, Rst<0>, RD<0>, Set<1>, Rst<1>, RD<1>, Set<2>, Rst<2>, and RD<2> are shown. Although timing sequence lines for control signals related to Sense Latch (SET_S, RST_S, and RD_S), as shown in FIG. 19B, no pulsed control signals at these inputs are actually received during the process of transcoding the count result in unary format to the count result in binary format.

As shown in FIG. 19B, at tc1', a pulsed control signal Prech_all is received. As shown in FIG. 9A, the pulsed control signal Prech_all turns on the power-supply transistor 954, hence node S0 is at high level. At tc2', pulsed control signals RD<0> and RD<1> are received, which turn on the fourth transistors 927 and 937, respectively, in the second counter stage 920 and the third counter stage 930, respectively. At this time, if both of Latch 0 and Latch 1 store logic 1, i.e., if both of nodes Fail<0> and Fail<1> are at logic 1, both of the third transistors 926 and 936 are turned off. As a result, S0 remains at high level. On the other hand, if not both of Latch 0 and Latch 1 store logic 1, i.e., if either of Latch 0 and Latch 1 stores logic 0, then at least one of the third transistors 926 and 936 is turned on. As a result, S0 is pulled down to low level. Because the counter 900 initially stores the count result in unary format, not both of Latch 0 and Latch 1 storing logic 1 would mean that at least Latch 1 stores logic 0 (and hence Latch 2 also stores logic 0). The pulsed control signals at tc2' essentially function to perform the operation at S1901 in FIG. 19A.

At tc3', a pulsed control signal Rst<0> is received. At this time, if S0 is at high level (i.e., both of Latch 0 and Latch 1 initially store logic 1), the common ground transistor 952 is on, and node com_s is at low level. Thus, the pulsed control signal Rst<0> can reset Latch 0 to store logic 0, i.e., node Fail<0> becomes logic 0. In this scenario, the pulsed control signal Rst<2> at tc4 essentially functions to perform the operation at S1902 in FIG. 19A.

On the other hand, if, at tc3', S0 is at low level (i.e., not both of Latch 0 and Latch 1 initially store logic 1), then the common ground transistor 952 is off, and node com_s is floating. Thus, the pulsed control signal Rst<0> will not have effect on Latch 0, and the logic bit stored in Latch 0 remains unchanged.

At tc4', a pulsed control signal Prech_all is received, as a result of which node S0 is at high level.

At tc5', a pulsed control signal RD<2> is received, which turns on the fourth transistor 947 in the fourth counter stage 940. At this time, if Latch 2 stores logic 1, i.e., if node Fail<2> is at logic 1, the third transistor 946 is off. As a result, S0 remains at high level. On the other hand, if Latch 2 stores logic 0, then the third transistor 946 is turned on. As a result, S0 is pulled down to low level. The pulsed control signal at tc5' essentially functions to perform the operation at S1903 in FIG. 19A.

At tc6', pulsed control signal Set<0> and Rst<2> are received. If, at tc6', S0 is at high level (i.e., Latch 2 stores logic 1), the common ground transistor 952 is on, and node com_s is at low level. Thus, the pulsed control signal Set<0> can set Latch 0 to store logic 1, i.e., node Fail<0> is at logic 1. Similarly, the pulsed control signal Rst<2> can reset Latch 2 to store logic 0, i.e., node Fail<2> is at logic 0. In this scenario, the pulsed control signals Set<0> and Rst<2> at tc6' essentially function to perform the operation at S1904 in FIG. 19A.

On the other hand, if, at tc6', S0 is at low level (i.e., Latch 2 stores logic 0), then the common ground transistor 952 is off, and node com_s is floating. Thus, the pulsed control signals Set<0> and Rst<2> will not have effect on Latch 0 and Latch 2, and the logic bits stored in Latch 0 and Latch 2 remain unchanged.

As compared to the method shown in FIGS. 18A and 18B, the method shown in FIGS. 19A and 19B can realize the binary conversion with a less number of pulses and hence a shorter time.

Tables 5-8 below summarize the change of logic bits at notes Fail<0>, Fail<1>, and Fail<2>, as well as voltage levels of nodes S0 and com_s, during the binary conversion operation for initially stored unary numbers 111, 011, 001, and 000, respectively. In these tables, H represents high level, L represents low level, F represents floating, and dash ("-") represents unknown, either way, or does not care.

TABLE 5

|  | Initial | tc1' | tc2' | tc3' | tc4' | tc5' | tc6' |
| --- | --- | --- | --- | --- | --- | --- | --- |
| S0 | — | H | H | H | H | H | H |
| com_s | — | L | L | L | L | L | L |

TABLE 5-continued

|  | Initial | tc1' | tc2' | tc3' | tc4' | tc5' | tc6' |
|---|---|---|---|---|---|---|---|
| Fail<0> | 1 | 1 | 1 | 0 | 0 | 0 | 1 |
| Fail<1> | 1 | 1 | 1 | 1 | 1 | 1 | 1 |
| Fail<2> | 1 | 1 | 1 | 1 | 1 | 1 | 0 |

TABLE 6

|  | Initial | tc1' | tc2' | tc3' | tc4' | tc5' | tc6' |
|---|---|---|---|---|---|---|---|
| S0 | — | H | H | H | H | H | H |
| com_s | — | L | L | L | L | L | L |
| Fail<0> | 1 | 1 | 1 | 0 | 0 | 0 | 1 |
| Fail<1> | 1 | 1 | 1 | 1 | 1 | 1 | 1 |
| Fail<2> | 1 | 1 | 1 | 1 | 1 | 1 | 0 |

TABLE 7

|  | Initial | tc1' | tc2' | tc3' | tc4' | tc5' | tc6' |
|---|---|---|---|---|---|---|---|
| S0 | — | H | L | L | H | L | L |
| com_s | — | L | F | F | L | F | F |
| Fail<0> | 1 | 1 | 1 | 1 | 1 | 1 | 1 |
| Fail<1> | 0 | 0 | 0 | 0 | 0 | 0 | 0 |
| Fail<2> | 0 | 0 | 0 | 0 | 0 | 0 | 0 |

TABLE 8

|  | Initial | tc1' | tc2' | tc3' | tc4' | tc5' | tc6' |
|---|---|---|---|---|---|---|---|
| S0 | — | H | L | L | H | L | L |
| com_s | — | L | F | F | L | F | F |
| Fail<0> | 0 | 0 | 0 | 0 | 0 | 0 | 0 |
| Fail<1> | 0 | 0 | 0 | 0 | 0 | 0 | 0 |
| Fail<2> | 0 | 0 | 0 | 0 | 0 | 0 | 0 |

Figure 20:
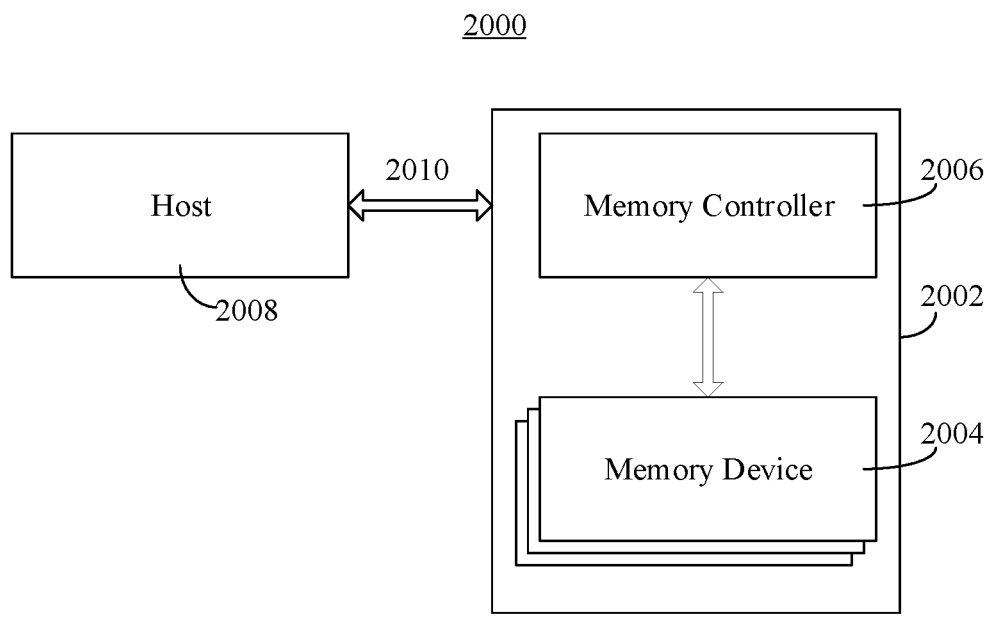
FIG. 20 is a block diagram of an example system according to some aspects of the present disclosure.

FIG. 20 is a block diagram of an example system 2000 having a memory device according to some aspects of the present disclosure. The system 2000 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 20, the system 2000 includes a memory system 2002 having one or more memory devices 2004 and a memory controller 2006. The system 2000 further includes a host 2008. The host 2008 can be a processor of an electronic device, such as a central processing unit (CPU), or a system-on-chip (SoC), such as an application processor (AP). The host 2008 can be configured to send or receive data to or from the one or more memory devices 2004. Each of the one or more memory devices 2004 can include a memory device according to some aspects of the present disclosure, such as one of the example memory devices described above.

The memory controller 2006 is coupled to the one or more memory devices 2004 and the host 2008, and is configured to control operation of the one or more memory devices 2004, according to some implementations. The memory controller 2006 can also be integrated into the one or more memory devices 2004. The memory controller 2006 can manage the data stored in the one or more memory devices 2004 and communicate with the host 2008 via an interface 2010. In some implementations, the memory controller 2006 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other implementations, the memory controller 2006 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 2006 can be configured to control operations of the one or more memory devices 2004, such as read, erase, and program operations.

Figure 21:
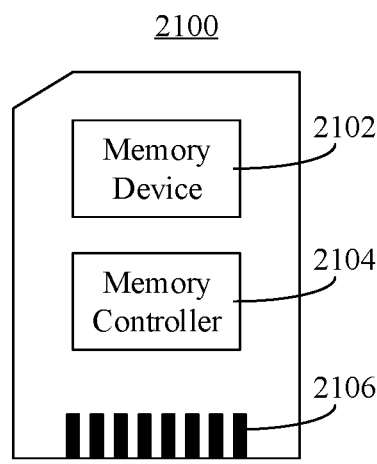
FIG. 21 is a block diagram of an example memory card according to some aspects of the present disclosure.
Figure 22:
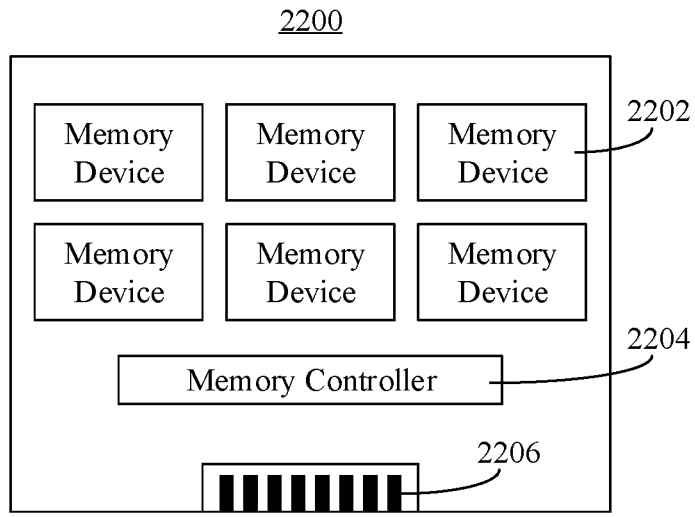
FIG. 22 is a block diagram of an example solid-state drive according to some aspects of the present disclosure.

The memory controller 2006 and the one or more memory devices 2004 can be integrated into various types of storage devices, for example, be included in the same package, such as a universal Flash storage (UFS) package or an eMMC package. That is, the memory system 2002 can be implemented and packaged into different types of end electronic products. FIGS. 21 and 22 are block diagrams of an example memory card 2100 and an example SSD 2200, respectively, according to some aspects of the present disclosure. As shown in FIG. 21, a single memory device 2102 and a memory controller 2104 are integrated into the memory card 2100. The memory device 2102 can include a memory device according to some aspects of the present disclosure, such as one of the above-described example memory devices. The memory card 2100 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 21, the memory card 2100 further includes a memory card interface or interface connector 2106 configured to couple the memory card 2100 to a host (e.g., the host 2008 shown in FIG. 20).

As shown in FIG. 22, multiple memory devices 2202 and a memory controller 2204 are integrated into the SSD 2200. Each of the memory devices 2202 can include a memory device according to some aspects of the present disclosure, such as one of the above-described example memory devices. As shown in FIG. 22, the SSD 2200 further includes an SSD interface or interface connector 2206 configured to couple the SSD 2200 to a host (e.g., the host 2008 shown in FIG. 20).

Figure 23:
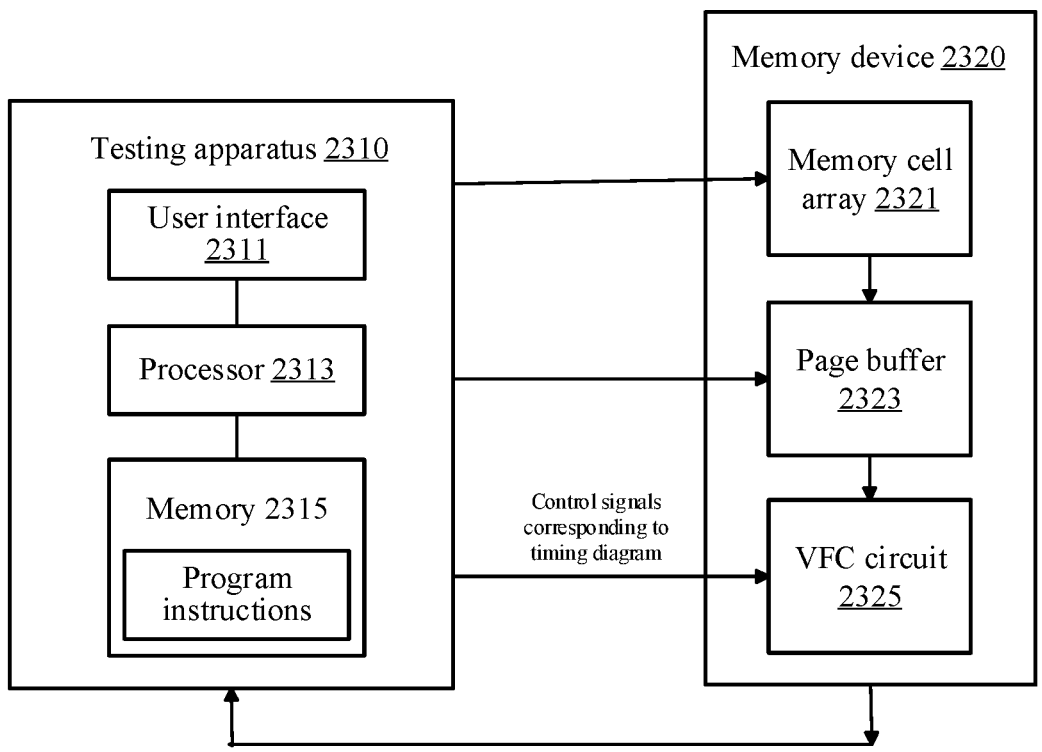
FIG. 23 is a schematic diagram showing a testing set-up including an example VFC circuit according to some aspects of the present disclosure.

FIG. 23 is a schematic diagram showing a testing set-up including an example VFC circuit according to some aspects of the present disclosure. As shown in FIG. 23, a testing apparatus 2310 (which can include, for example, the host 2008 in FIG. 20) is connected to a memory device 2320. The testing apparatus 2310 includes a user interface 2311, a processor 2313, and a memory 2315 storing program instructions. A user can interact with the testing apparatus 2310 through the user interface 2311. The memory device 2320 includes a memory cell array 2321, a buffer circuit 2323, and a VFC circuit 2325.

In some implementations, the processor 2313 executes the program instruction stored in the memory 2315 to perform an operation according to some aspects of the present disclosure. For example, the processor 2313 can control to generate control signals to control the VFC circuit 2325 to accurately count the fail bits in the memory cell array.

In some implementations, the user interface 2311 can be a liquid crystal display (LCD) or an organic light-emitting diode (OLED) display having a touch-control function. The user interface 2311 can also include a keyboard, a mouse, a USB interface, and a communication interface. A user can use the keyboard, the mouse, and the USB interface to set up the verification operation of the memory device 2320. The processor 2313 can be a central processing unit (CPU). The processor 2313 can also include a hardware chip. The hardware chip can be, e.g., an application-specific integrated circuit (ASIC), a programmable logic device (PLD), or a combination thereof. For example, the PLD can be a complex programmable logic device (CPLD), a field-programmable gate array (FPGA), or a combination thereof. The memory 2315 can include a volatile memory and/or a non-volatile memory.

According to some aspects of the present disclosure, the digital VFC circuit accurately counts the fail bits without undercounting and/or overcounting. Thus, the yield of the memory device can be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the scope of the present disclosure.

What is claimed is:

1. A memory device comprising:
   a memory cell array including one or more memory sections each including one or more memory cells;
   a buffer circuit including one or more buffers each coupled to one of the one or more memory sections;
   a verify failbit count (VFC) circuit coupled to the buffer circuit and including a counter, the counter including one or more counter stages coupled in series from an input of the counter; and
   a control logic coupled to the VFC circuit and configured to control the counter to:
   sequentially receive, at the input of the counter, a bit group including one or more verification bits, each of the one or more verification bits indicating a verification result of one memory cell in the memory cell array and being a fail bit or a pass bit; and
   for one verification bit of the one or more verification bits, perform a determination process according to a position of the one verification bit in the group to select one of the one or more counter stages for writing a fail bit or to decide to discard the one verification bit.

2. A failbit counting method for the memory device of claim 1, comprising:
   sequentially receiving, at the input of the counter, the bit group including the one or more verification bits; and
   for one verification bit of the one or more verification bits, performing the determination process according to the position of the one verification bit in the group to select one of the one or more counter stages for writing a fail bit or to decide to discard the one verification bit.

3. The failbit counting method according to claim 2, wherein performing the determination process according to the position of the one verification bit in the group includes, in response to the one verification bit being a pass bit, deciding to discard the one verification bit.

4. The failbit counting method according to claim 2, wherein performing the determination process according to the position of the one verification bit in the group includes:
   in response to the one verification bit being a fail bit, selecting a closest available counter stage for writing a fail bit, the closest available counter stage being one of the one or more counter stages that does not have a fail bit already stored therein and is closest to the input of the counter.

5. The failbit counting method according to claim 2, wherein performing the determination process according to the position of the one verification bit in the group includes:
   in response to the one verification bit being a first verification bit in the bit group, determining whether the one verification bit is a fail bit.

6. The failbit counting method according to claim 5, wherein performing the determination process according to the position of the one verification bit in the group further includes:
   in response to the one verification bit being a fail bit, selecting a first counter stage of the one or more counter stages for writing a fail bit.

7. The failbit counting method according to claim 2, wherein:
   the one or more counter stages include a plurality of counter stages; and
   performing the determination process according to the position of the one verification bit in the group includes:
   in response to the verification bit being an N-th verification bit in the bit group, determining whether a condition that the one verification bit is a fail bit and a first counter stage to an (N−1)-th counter stage of the plurality of counter stages each already have a fail bit stored therein is satisfied, N being an integer greater than one.

8. The failbit counting method according to claim 7, wherein performing the determination process according to the position of the one verification bit in the group further includes:
   in response to the condition being satisfied, selecting an N-th counter stage of the plurality of counter stages for writing a fail bit.

9. The failbit counting method according to claim 7, wherein:
   the plurality of counter stages include three or more counter stages, N is an integer greater than two, and the condition is a first condition; and
   performing the determination process according to the position of the one verification bit in the group further includes:
   in response to the first condition being not satisfied, determining whether a second condition that the one verification bit is a fail bit and the first counter stage to an (N−2)-th counter stage of the plurality of counter stages each already have a fail bit stored therein is satisfied.

10. The failbit counting method according to claim 9, wherein performing the determination process according to the position of the one verification bit in the group further includes:
    in response to the second condition being satisfied, selecting the (N−1)-th counter stage for writing a fail bit.

11. The memory device according to claim 1, wherein the control logic is further configured to control the counter to, in response to the one verification bit being a pass bit, decide to discard the one verification bit.

12. The memory device according to claim 1, wherein the control logic is further configured to control the counter to:
    in response to the one verification bit being a fail bit, select a closest available counter stage for writing a fail bit, the closest available counter stage being one of the one or more counter stages that does not have a fail bit already stored therein and is closest to the input of the counter.

13. The memory device according to claim 1, wherein the control logic is further configured to control the counter to:
in response to the one verification bit being a first verification bit in the bit group, determine whether the one verification bit is a fail bit.

14. The memory device according to claim 13, wherein the control logic is further configured to control the counter to:
in response to the one verification bit being a fail bit, select a first counter stage of the one or more counter stages for writing a fail bit.

15. The memory device according to claim 1, wherein:
the one or more counter stages include a plurality of counter stages; and
the control logic is further configured to control the counter to:
in response to the verification bit being an N-th verification bit in the bit group, determine whether a condition that the one verification bit is a fail bit and a first counter stage to an (N−1)-th counter stage of the plurality of counter stages each already have a fail bit stored therein is satisfied, N being an integer greater than one.

16. The memory device according to claim 15, wherein the control logic is further configured to control the counter to:
in response to the condition being satisfied, select an N-th counter stage of the plurality of counter stages for writing a fail bit.

17. The memory device according to claim 15, wherein:
the plurality of counter stages include three or more counter stages, N is an integer greater than two, and the condition is a first condition; and
the control logic is further configured to control the counter to:
in response to the first condition being not satisfied, determine whether a second condition that the one verification bit is a fail bit and the first counter stage to an (N−2)-th counter stage of the plurality of counter stages each already have a fail bit stored therein is satisfied.

18. The memory device according to claim 17, wherein the control logic is further configured to control the counter to:
in response to the second condition being satisfied, select the (N−1)-th counter stage for writing a fail bit.

19. A memory system comprising:
a memory device including:
a memory cell array including one or more memory sections each including one or more memory cells;
a buffer circuit including one or more buffers each coupled to one of the one or more memory sections;
a verify failbit count (VFC) circuit coupled to the buffer circuit and including a counter, the counter including one or more counter stages coupled in series from an input of the counter; and
a control logic coupled to the VFC circuit and configured to control the counter to:
sequentially receive, at the input of the counter, a bit group including one or more verification bits, each of the one or more verification bits indicating a verification result of one memory cell in the memory cell array and being a fail bit or a pass bit; and
for one verification bit of the one or more verification bits, perform a determination process according to a position of the one verification bit in the group to select one of the one or more counter stages for writing a fail bit or to decide to discard the one verification bit; and
a memory controller coupled to the memory device and configured to control the memory device.

20. The memory system according to claim 19, wherein the control logic is further configured to control the counter to:
in response to the one verification bit being a fail bit, select a closest available counter stage for writing a fail bit, the closest available counter stage being one of the one or more counter stages that does not have a fail bit already stored therein and is closest to the input of the counter.

* * * * *